(12) United States Patent
Kim et al.

(10) Patent No.: US 11,947,840 B2
(45) Date of Patent: Apr. 2, 2024

(54) INTER-DIE REFRESH CONTROL

(71) Applicant: Micron Technology, Inc., Boise, ID (US)

(72) Inventors: Kang-Yong Kim, Boise, ID (US); Hyun Yoo Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 225 days.

(21) Appl. No.: 17/513,311

(22) Filed: Oct. 28, 2021

(65) Prior Publication Data

US 2022/0137881 A1 May 5, 2022

Related U.S. Application Data

(60) Provisional application No. 63/108,201, filed on Oct. 30, 2020.

(51) Int. Cl.
*G06F 3/06* (2006.01)
*G11C 11/406* (2006.01)

(52) U.S. Cl.
CPC .......... *G06F 3/0659* (2013.01); *G06F 3/0604* (2013.01); *G06F 3/0673* (2013.01); *G11C 11/40611* (2013.01); *G11C 11/40615* (2013.01)

(58) Field of Classification Search
CPC .... G06F 3/0659; G06F 3/0604; G06F 3/0673; G11C 11/40611; G11C 11/40615
See application file for complete search history.

(56) References Cited

U.S. PATENT DOCUMENTS 6,879,536 B2 * 4/2005 Lee ...................... G11C 7/1063
365/222
9,293,187 B2 * 3/2016 Iyer ................... G11C 11/40618
(Continued)

FOREIGN PATENT DOCUMENTS

KR 20190046572 5/2019

OTHER PUBLICATIONS

"International Preliminary Report on Patentability", Application No. PCT/US2021/057358, dated May 2, 2023, 7 pages.
(Continued)

*Primary Examiner* — Idriss N Alrobaye
*Assistant Examiner* — Richard B Franklin
(74) *Attorney, Agent, or Firm* — Colby Nipper PLLC

(57) ABSTRACT

Described systems, apparatuses, and methods relate to volatile memories that are refreshed to maintain data integrity, such as dynamic random-access memory (DRAM) and synchronous DRAM (SDRAM). A memory device includes multiple dies, with each die having a memory array to be refreshed. The multiple dies may be interconnected via at least one inter-die bus of the memory device. A memory controller sends a command to the memory device to enter a self-refresh mode. In response, a die of the multiple dies can enter the self-refresh mode and initiate or otherwise coordinate refresh operations of the other dies. To do so, the die may transmit at least one refresh-related command to at least one other die using the inter-die bus. Multiple different signaling schemes and timing approaches are disclosed. The described inter-die refresh control principles may be implemented in energy-efficient applications, such as in low-power double data rate (LPDDR) SDRAM.

40 Claims, 13 Drawing Sheets

(56) References Cited

U.S. PATENT DOCUMENTS

| | | | |
|---|---|---|---|
| 10,950,288 B2* | 3/2021 | Nale | ............... G06F 3/0619 |
| 2018/0096719 A1* | 4/2018 | Tomishima | ............ G11C 29/48 |
| 2019/0221249 A1 | 7/2019 | Best et al. | |
| 2019/0333550 A1 | 10/2019 | Fisch | |
| 2020/0176047 A1 | 6/2020 | Meier et al. | |
| 2020/0219555 A1 | 7/2020 | Rehmeyer | |

OTHER PUBLICATIONS

"International Search Report and Written Opinion", Application No. PCT/US2021/057358, dated Feb. 21, 2022, 10 pages.

* cited by examiner

INTER-DIE REFRESH CONTROL

RELATED APPLICATION

This application claims priority under 35 U.S.C. § 119(e) to U.S. Provisional Patent Application 63/108,201, filed on Oct. 30, 2020 which is incorporated herein by reference in its entirety.

BACKGROUND

Computers, smartphones, and other electronic devices operate using processors and memories. A processor executes code based on data to provide features to a user. The processor obtains the code and the data from a memory that can store information. Thus, like a processor's speed or number of cores, a memory's characteristics can impact the performance of an electronic device. Different types of memory have different characteristics. Memory types include volatile memory and nonvolatile memory, such as random access memory (RAM) and flash memory, respectively. RAM can include static RAM (SRAM) and dynamic RAM (DRAM). Some types of memory are intended for fixed installations like a data center server, and other types are designed for compact or portable devices like a notebook computer. Various types of memory may also target power-efficient applications.

Computing architectures may employ memory in different manners for different purposes, including across multiple levels of a hierarchical memory system. Examples of hierarchical memory levels include, from faster to slower, a cache memory, a main memory, and a storage memory. Different memory systems and hierarchical memory levels can have different designated purposes or can be organized in multiple ways to support an overall computing system. Computer designers and engineers therefore strive to deploy and adapt various memory types for different memory purposes and hierarchical levels to achieve some desired memory system performance. These efforts are complicated, however, by the diverging strengths and capabilities of different types of memories. It is therefore challenging to configure, organize, and operate any of various memory types to achieve a target performance for a given electronic device.

BRIEF DESCRIPTION OF THE DRAWINGS

Apparatuses of and techniques for inter-die refresh control are described with reference to the following drawings. The same numbers are used throughout the drawings to reference like features and components.

DETAILED DESCRIPTION

Overview

Figure 1:
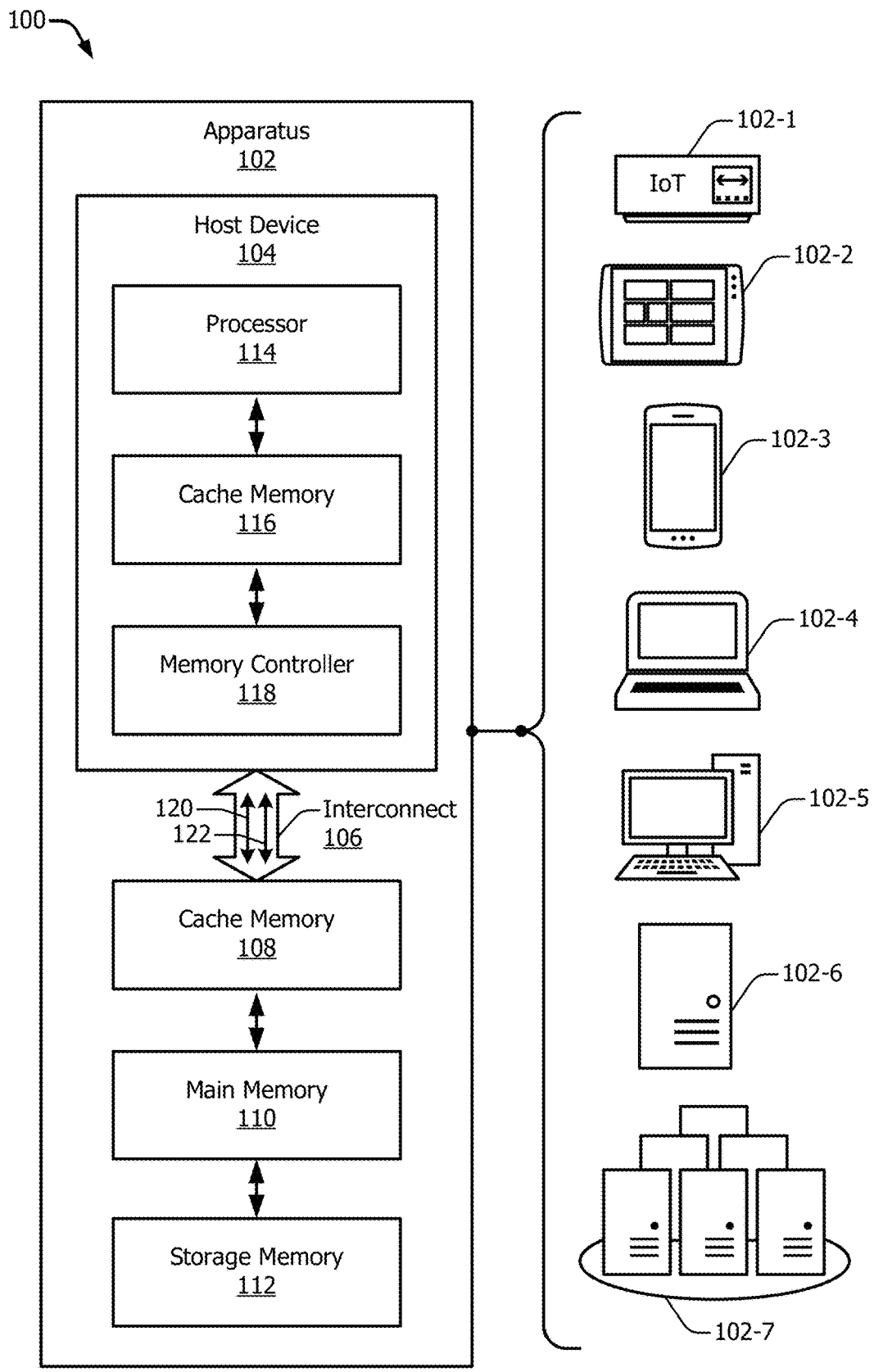
FIG. 1 illustrates example apparatuses that can implement inter-die refresh control.

For some purposes, memory types can be divided into nonvolatile memory types and volatile memory types. The information stored in nonvolatile memory persists even after power is removed from the nonvolatile memory. Examples of nonvolatile memory include a hard disk drive (HDD), a solid-state drive (SSD), and flash memory. With volatile memory, on the other hand, information is lost once the memory is deprived of power. Volatile memory, however, can operate faster than nonvolatile memory. Accordingly, volatile memory is deployed in computer architectures where speed is important, like in working memory or at higher levels of a hierarchical memory system. Computer engineers therefore use volatile memory for cache memory, main memory, and the like.

Two relatively common types of volatile memory are static random-access memory (SRAM) and dynamic random-access memory (DRAM). SRAM is faster but more expensive. Conversely, DRAM may be slower, but DRAM costs less per bit of information that can be stored. Memory system designers therefore use SRAM for relatively smaller memories that are responsible for quickly responding to memory requests issued by a processor. Accordingly, some cache memories are formed using SRAM. DRAM is deployed for relatively larger memories that can afford to operate more slowly than the cache memory of a hierarchal memory system. Thus, some main memories are formed with DRAM. This strategy enables the less costly memory type, DRAM, to be used to store relatively more information.

DRAM has a lower cost per bit than SRAM because each DRAM memory cell can be made with fewer components that occupy a smaller area of an integrated circuit (IC) chip. Engineers can build an SRAM cell that holds one bit of information using six transistors. In contrast, a DRAM cell that stores one bit of information may be built with one transistor and one capacitor. By occupying less area per bit than six transistors, the transistor and capacitor pair of DRAM enable more bits to be packed into a given area of an IC chip. Because IC chip area is expensive, DRAM cells have a lower cost per bit, and DRAM can therefore be used to store information for applications and memory architectures in which an amount of data storage is a premium factor.

The capacitor creates a functional distinction between DRAM and SRAM memory cells. The six transistors of an SRAM cell constantly maintain a bit of information while the power is continuously supplied. With a DRAM cell, on the other hand, the capacitor slowly leaks charge, and the charge represents the bit of information. To counteract this charge leakage, memory systems periodically refresh DRAM cells to restore the charge in each capacitor of each bit cell. The time consumed by a refresh operation can present memory system challenges, as is explained below.

The capabilities of computing systems are continuously increasing. These increased capabilities have a voracious appetite for ever increasing amounts of memory. For example, advanced operating systems (OSes), neural processing units, larger camera sensor sizes, virtual reality games, and so forth demand ever greater memory capacities. Computer engineers may choose to meet the demands for larger memory capacities with DRAM. Using DRAM, however, involves working with refresh operations for the DRAM cells.

Refresh operations consume some finite amount of time, and the DRAM is unavailable to fulfill memory requests during this time. For a refresh operation, control logic of a memory reads the remaining charge value from a capacitor of a memory cell. The control logic then writes this charge value back into the memory cell at full strength. This refresh operation is applied to each memory cell of a memory array. In some cases, the memory array is organized into rows and columns. An entire row may be refreshed at once in some DRAM architectures in such cases. Nonetheless, an appreciable amount of time is consumed to complete a refresh operation across a whole memory array. During this time, the DRAM cannot process memory requests, like memory reads and writes, from a memory controller or host device.

Thus, refresh operations create times when DRAM is unavailable to support the computing efforts of a processor. During these times, the processor may be forced to stall and wait for a refresh operation to conclude before the DRAM performs a memory request. This waiting decreases the performance of the computing system. Further, this decreased performance can be compounded as memory sizes increase.

To accommodate a larger total memory size, a memory system can employ more memory IC chips, or dies. With some memory system architectures, each die may at least partially independently perform self-refresh operations in a self-refresh mode, which is described below. In an auto-refresh mode, a memory controller of a host device can control the timing of refresh operations across multiple dies. The auto-refresh mode entails providing power to an interconnect, which extends between the memory controller and the memory, and to other circuitry. To save power, the memory controller may instruct the dies of the memory to enter the self-refresh mode. In the self-refresh mode, each die performs refresh operations according to a timing that is determined internal to that memory IC chip. This timing can vary between dies, especially if the temperature deviates among several dies because each die may determine refresh frequency based on temperature, which affects how quickly a capacitor may lose charge.

Consequently, in a large memory system with many memory dies, each die may be performing a self-refresh operation at different times. Even if the dies start a self-refresh mode with approximately similar refresh patterns, the timing of self-refresh operations is likely to drift over time. This can result in random self-refresh timings, and randomized self-refresh timings cause difficulties when the memory controller terminates the self-refresh mode. Upon exiting the self-refresh mode responsive to a memory controller command, each die is responsible for gracefully concluding the self-refresh mode, perhaps by ensuring that any current or imminent self-refresh operations are completed. While these self-refresh operations are being completed, the various dies cannot respond to memory requests from the memory controller.

Because of the lack of coordinated self-refresh operations, different ones of multiple dies may be engaged in a self-refresh operation when the memory controller commands the memory to exit the self-refresh mode. Moreover, with uncoordinated self-refresh operations, the likelihood that at least one die is performing a self-refresh operation when a self-refresh exit command is issued may dramatically increase. If only one die is performing a self-refresh operation, the memory controller waits for that die to complete the operation before accessing that die or any associated dies. The uncoordinated refresh operations can therefore cause the memory controller to delay issuing memory requests to the memory, which slows processor operations. This negative effect is intensified when the accessing of multiple dies is linked. For example, a memory controller may jointly access a group of dies. If so, then if one of the dies is performing a self-refresh operation, the memory controller cannot access any of the dies in the group.

This interdependency of IC memory chips is increasing along with increasing total memory sizes. For example, to support greater memory capacities, multi-ranks and byte-mode may be used. In such cases, multiple dies can be in the same rank and same channel. This adversely impacts processing performance if the multiple dies have uncoordinated self-refresh operations, especially when the multiple dies exit a power-saving self-refresh mode and cause the processor to stall as even one die finishes a self-refresh operation.

To counteract the uncoordinated self-refresh operations that lead to lower computing performance, memory devices can coordinate self-refresh operations across multiple dies. This document describes such coordination in which a die of multiple dies operates as a master or leader and the other dies operate as a slave or follower in terms of controlling a timing of refresh operations. In example implementations, a computing system includes a host device with a memory controller and a memory device. The host device is coupled to the memory device via an interconnect. The memory device includes multiple dies, and each die respectively includes a memory array to store information.

In operation, the memory controller transmits a command to the memory device over the interconnect; the command directs the memory device to enter a self-refresh mode. At least a first, or master, die receives the self-refresh entry command via the interconnect. Responsive to the command, the first die enters a self-refresh mode in which refresh operations are not controlled by the memory controller. Instead, the first die controls the timing of the refresh operations (e.g., the self-refresh operations) for the memory array of the first die. The first die also controls the timing of the refresh operations for the memory arrays of the other dies of the multiple dies.

The multiple dies of the memory device are coupled together. In some cases, the multiple dies are coupled together using an inter-die bus that is part of the memory device. The first die transmits an inter-die refresh command over the inter-die bus to at least one other die of the multiple dies, such as a second die. Responsive to receiving the inter-die refresh command, the second die performs a refresh operation (e.g., a self-refresh operation) for the memory array thereof. Other dies of the multiple dies are likewise prompted to perform a respective refresh operation responsive to the inter-die refresh command. In example approaches, the first die may send the same inter-die refresh command to each die of the multiple dies. Alternatively, the first die may send separate inter-die refresh commands to the multiple dies. In other example approaches, the second die may forward another inter-die refresh command to a third die responsive to receiving the inter-die refresh command from the first die. This document describes these and other example approaches for distributing inter-die refresh commands to the multiple dies using the inter-die bus.

Each die of the multiple dies of the memory device refreshes its respective memory array each multi-die refresh cycle. The timing of a start for each multi-die refresh cycle can be controlled by the first die. To do so, the first die can establish a timer based on a temperature provided by a respective temperature sensor and using a respective reference oscillator. The other dies can therefore depower (e.g., remove power from) their respective temperature sensors and reference oscillators. Removing power from these components further reduces power consumption for the computing system beyond entering the self-refresh mode. Within each multi-die refresh cycle, the timing of individual refresh operations in each individual die can also be controlled at least partially by the first die. The first die, potentially in conjunction with one or more register settings, can time refresh operations among the multiple dies to occur substantially simultaneously, partially overlapping, at different non-overlapping times, or some combination thereof. This document also describes examples of refresh operation timings within a multi-die refresh cycle.

Thus, the first die can control a start of each multi-die refresh cycle across the multiple dies. Further, the first die can at least partially control a timing of each respective refresh operation of each respective die relative to the timings of other dies of the multiple dies. In these manners, the memory device can control when the refresh operations across the multiple dies occur as part of a self-refresh mode. This control can enable the refresh operations to be coordinated such that they occur in a relatively compressed time period instead of being scattered or dispersed over time.

Accordingly, when the memory controller commands the memory device to exit the power-saving self-refresh mode, the host device is less likely to need to wait for a self-refresh operation to complete before starting to send memory requests. This advantage is multiplied for memory architectures in which groups having multiple dies are accessed together, such as multiple dies in a same rank and in a same channel. Over time, the described techniques accrue an appreciable increase in processing time because processor stalls due to waiting for self-refresh operations to complete are avoided. Thus, implementing inter-die refresh control can increase computing performance by reducing at least a frequency of processor stalls due to ongoing self-refresh operations when exiting a power-saving self-refresh mode.

Further, due to the increased performance provided by inter-die refresh control, the memory controller can afford to command the memory device to enter the self-refresh mode more frequently and thereby save additional power. Power savings can also be increased by turning off self-refresh timing components, such as temperature sensors and internal reference oscillators, in each of the dies except one. The apparatuses and methods that are described herein are therefore particularly appropriate for memory that is designed for lower power operations or that is targeted for energy-efficient applications. Thus, the described principles may be incorporated into a low-power memory device. An example of a memory standard that relates to low-power applications is the Low-Power Double Data Rate (LPDDR) standard for synchronous DRAM (SDRAM) as promulgated by the Joint Electron Device Engineering Council (JEDEC) Solid State Technology Association. Some terminology in this document may draw from one or more of these standards, like the LPDDR5 standard, for clarity. The described principles, however, are also applicable to memories that comport with other standards, including other LPDDR standards (e.g., earlier versions or future versions like LPDDR6), and to memories that do not adhere to a standard.

Example Operating Environments

FIG. 1 illustrates, at 100 generally, example apparatuses 102 that can implement inter-die refresh control. The apparatus 102 can be realized as, for example, at least one electronic device. Example electronic-device implementations include an internet-of-things (IoTs) device 102-1, a tablet device 102-2, a smartphone 102-3, a notebook computer 102-4, a desktop computer 102-5, a server computer 102-6, and a server cluster 102-7 that may be part of cloud computing infrastructure or a data center. Other apparatus 102 examples include a wearable device, such as a smartwatch or intelligent glasses; an entertainment device, such as a set-top box, a smart television, or a gaming device; a motherboard or server blade; a consumer appliance; vehicles or the electronic components thereof; industrial equipment; a security or other sensor device; and so forth. Each type of electronic device or other apparatus can include one or more components to provide some computing functionality or feature.

In example implementations, the apparatus 102 can include at least one host device 104, at least one interconnect 106, at least one cache memory 108, at least one main memory 110, and at least one storage memory 112. The host device 104 can include at least one processor 114, at least one cache memory 116, and at least one memory controller 118. The interconnect 106 can include at least one command and address bus 120 (CA bus 120) and at least one data bus 122 (DQ bus 122). The main memory 110 may be realized, for example, with a dynamic random-access memory (DRAM) device or module, including with a three-dimensional (3D) stacked DRAM device, such as a high bandwidth memory (HBM) device or a hybrid memory cube (HMC) device. The storage memory 112 may be realized, for example, with a storage-class memory device, such as one employing 3D XPoint™ or phase-change memory (PCM), a hard disk or solid-state drive, or flash memory.

Regarding the host device 104, the processor 114 is coupled to the cache memory 116, and the cache memory 116 is coupled to the memory controller 118. The processor 114 is also coupled, directly or indirectly, to the memory controller 118. The host device 104 may include other components to form, for instance, a system-on-a-chip (SoC). The processor 114 may include or comprise a general-purpose processor, a central processing unit (CPU), a graphics processing unit (GPU), a neural network engine or accelerator, an application-specific integrated circuit (ASIC), a field-programmable gate array (FPGA) IC, a communications processor (e.g., a modem or baseband processor), an SoC, and so forth. In operation, the memory controller 118 can provide a high-level or logical interface between the processor 114 and at least one memory (e.g., a memory that is external to the host device 104). The memory controller 118 can, for example, receive memory requests from the processor 114 and provide the memory requests to the external memory with appropriate formatting, timing, reordering, and so forth. The memory controller 118 can also forward to the processor 114 responses to the memory requests that are received from the external memory.

Regarding connections that are external to the host device 104, the host device 104 is coupled to the cache memory 108 via the interconnect 106. The cache memory 108 is coupled to the main memory 110, and the main memory 110 is coupled to the storage memory 112. The host device 104 is also coupled, directly or indirectly, to the main memory 110 and the storage memory 112 via the interconnect 106. The depicted interconnect 106, as well as other interconnects that communicatively couple together various components (not shown), enable data to be transferred between or among the various components. Interconnect examples include a bus, a switching fabric, one or more wires that carry voltage or current signals, and so forth.

The depicted components of the apparatus 102 represent an example computing architecture with a hierarchical memory system. A hierarchical memory system may include memories at different levels, with each level having a memory with a different speed or capacity. As shown, the cache memory 116 is logically coupled between the processor 114 and the cache memory 108. The cache memories 116 and 108 are logically coupled between the processor 114 and the main memory 110. Here, the cache memory 116 is at a higher level of the hierarchical memory system than is the cache memory 108. Similarly, the cache memory 108 is at a higher level of the hierarchical memory system than is the main memory 110. The storage memory 112, in turn, is deployed at a lower level than the main memory 110.

Although various implementations of the apparatus 102 are depicted in FIG. 1 and described herein, an apparatus 102 can be implemented in alternative manners. For example, the host device 104 may include multiple cache memories, including multiple levels of cache memory, or no cache memory. In some cases, the host device may omit the processor 114. Another memory, such as the main memory 110, may have a respective "internal" cache memory (not shown). Further, there may be no cache memory between the interconnect 106 and the main memory 110. Generally, the illustrated and described components may be implemented in alternative ways, including in distributed or shared memory systems. A given apparatus 102 may also include more, fewer, or different components.

The host device 104 and the various memories may be realized in multiple manners. In some cases, the host device 104 and the main memory 110 can both be disposed on, or physically supported by, a same printed circuit board (PCB) (e.g., a motherboard). A memory may also be coupled to multiple host devices 104 via one or more interconnects 106 and able to respond to memory requests from two or more of them. Each host device 104 may include a respective memory controller 118, or the multiple host devices 104 may share a common memory controller 118. An example architecture with at least one host device 104 that is coupled to a memory device is described next.

Example Techniques and Hardware

Figure 2:
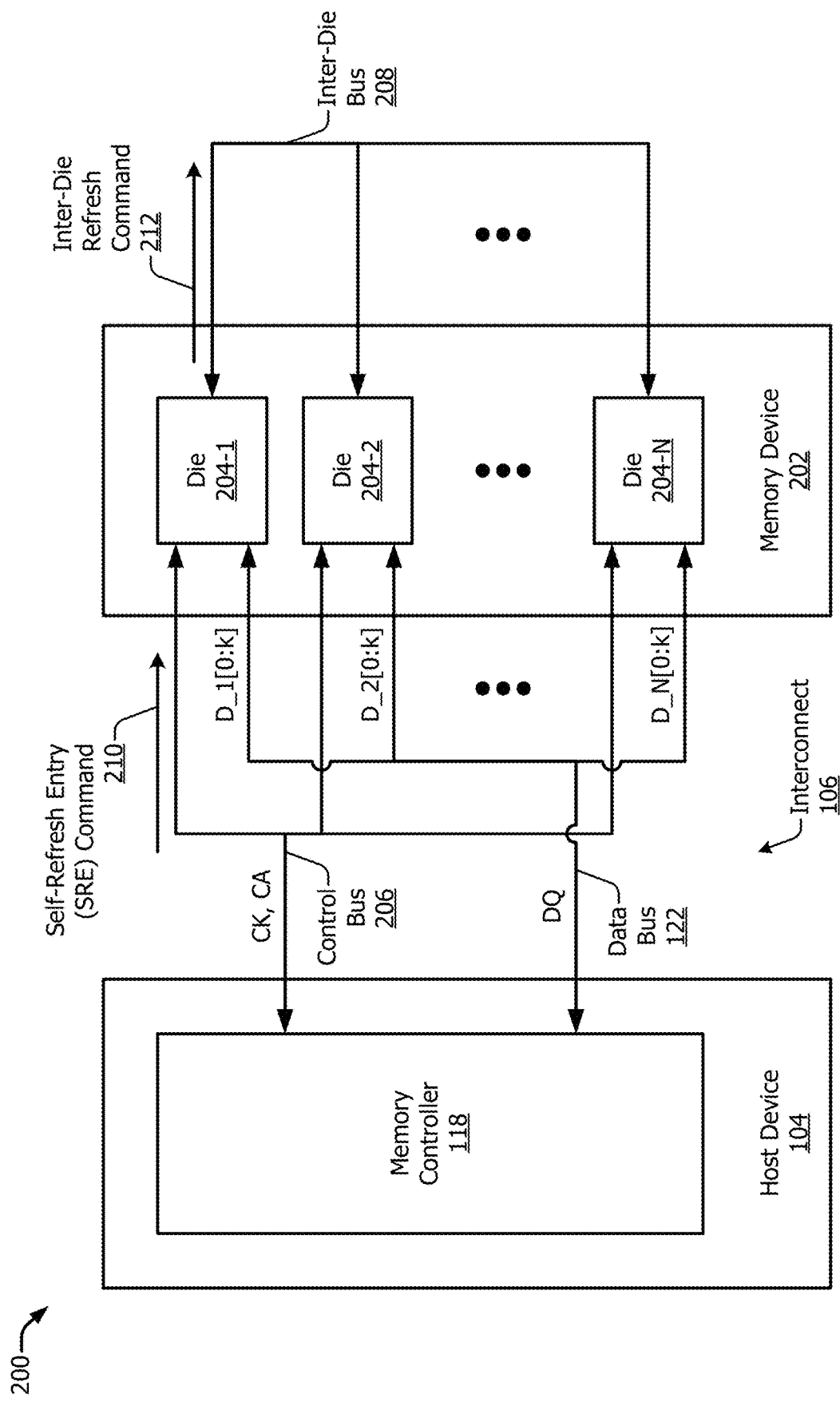
FIG. 2 illustrates an example host device with a memory controller coupled to an example memory device including multiple dies that can implement inter-die refresh control.

FIG. 2 illustrates a computing system 200 including an example host device 104 with a memory controller 118 coupled to an example memory device 202 that can implement inter-die refresh control. The memory device 202 includes a first die 204-1, a second die 204-2, . . . , and an "Nth" die 204-N, with "N" representing a positive integer greater than one. As shown, the interconnect 106 is coupling the memory controller 118 to the memory device 202.

In example implementations, the interconnect 106 can include a control bus 206 (CK, CA) and the data bus 122 (DQ). Each bus may be implemented as a unidirectional bus or a bidirectional bus. The control bus 206 can include a clock bus (CK) and a command and address bus (CA) (not separately shown in FIG. 2). The memory controller 118 can use the CK bus to provide clock signals to the memory device 202. The command and address (CA) bus can correspond to the CA bus 120 (e.g., of FIGS. 1, 3, and 4). The memory controller 118 can be coupled to each die 204 of the multiple dies 204-1 . . . 204-N via the control bus 206.

The memory controller 118 can also be coupled to each die 204 of the multiple dies 204-1 . . . 204-N via the data bus 122 (DQ bus 122). Accordingly, "k" bits can be transferred between the memory controller 118 and the first die 204-1 as indicated by "D_1[0:k]," where "k" is a positive integer. Similarly, "k" bits can be transferred between the memory controller 118 and the second die 204-2 as indicated by "D_2[0:k]," and "k" bits can be transferred between the memory controller 118 and the "Nth" die 204-N as indicated by "D_N[0:k]."

As shown, the computing system 200 also includes an inter-die bus 208. The multiple dies 204-1 . . . 204-N can be coupled to each other via the inter-die bus 208. The inter-die bus 208 can be external to the memory device 202, internal to the memory device 202, or partially internal and partially external to the memory device 202. In some cases, at least the first die 204-1 is communicatively coupled to each other die 204 of the multiple dies 204-1 . . . 204-N via the inter-die bus 208. Further, each die 204 may be communicatively coupled to each other die 204 of the multiple dies 204-1 . . . 204-N via the inter-die bus 208. In other cases, a given die 204 may be "directly" communicatively coupled to a subset (e.g., fewer than all) of the dies of the multiple dies 204-1 . . . 204-N via the inter-die bus 208. For example, the first die 204-1 may be directly communicatively coupled to 3 of 15 other dies of the multiple dies 204-1 . . . 204-N (e.g., if N=16). The inter-die bus 208 may be dedicated to, or for the exclusive use of, the multiple dies 204-1 . . . 204-N or other components of the memory device 202. Alternatively, the inter-die bus 208 may be shared with, or exposed to, components that are external to the memory device 202.

In some aspects, the memory device 202 may be realized as a "separate" physical component relative to the host device 104. Examples of physical components, which may be separate, include: a printed circuit board (PCB), which can be rigid or flexible; a memory card; a memory stick; a memory module, including a single in-line memory module (SIMM) or a dual in-line memory module (DIMM); and so forth. Alternatively, the memory device 202 may be packaged or integrated with other physical components—including the host device 104, such as on a common PCB or together in a single device package.

In example operations, inter-die refresh control can include using two commands. A first command directs the memory device 202 to enter a self-refresh mode, and a second command instructs a die 204 to perform a refresh operation during the self-refresh mode. These commands are described below. The host device 104 determines to cause the memory device 202 to enter an energy-efficient or low-power mode or state. The determination may be made by the processor 114 (of FIG. 1), the memory controller 118, or some combination thereof. To implement the low-power mode, the memory controller 118 transmits at least one self-refresh entry (SRE) command 210 to the memory device 202 via the interconnect 106. The memory controller 118 can transmit the SRE command 210 to the memory device 202 over, for example, the control bus 206, such as over the CA bus 120 (e.g., of FIGS. 1, 3, and 4). The memory controller 118 transmits the SRE command 210 to at least one die 204 of the memory device 202. In some aspects, the memory controller 118 transmits the SRE command 210 to the first die 204-1 via the control bus 206. In other aspects, the memory controller 118 can transmit the SRE command 210 to multiple ones of the multiple dies 204-1 . . . 204-N.

At the memory device 202, at least the first die 204-1 receives the SRE command 210 from the memory controller 118. Multiple dies, including each of the "N" dies 204-1 . . . 204-N, may also receive the SRE command 210 from the host device 104. The first die 204-1 processes the SRE command 210 to enter a self-refresh mode in which the first die 204-1 can control the self-refresh operations for a memory array thereof. The other dies, if they receive the SRE command 210, can also enter the self-refresh mode responsive to the SRE command 210. The other dies may not, however, independently control a timing of their respective self-refresh operations. Instead, the first die 204-1 at least partially coordinates the timing of the multiple self-refresh operations across the multiple dies 204-1 . . . 204-N using the inter-die bus 208.

To implement inter-die refresh control, the first die 204-1 transmits at least one inter-die refresh command 212 to at least one other die 204 of the multiple dies 204-1 . . . 204-N. The first die 204-1 transmits the inter-die refresh command 212 on the inter-die bus 208 responsive to receiving the SRE command 210. Transmitting the inter-die refresh command 212 enables the first die 204-1 to coordinate various self-refresh operations across the multiple dies 204-1 . . . 204-N. The first die 204-1 can transmit a single inter-die refresh command 212 to multiple dies, can transmit separate respective inter-die refresh commands 212 to each respective die, can cause certain dies to transmit other inter-die refresh commands 212 to other dies, and so forth. This document describes example signaling schemes for transmitting and propagating one or more inter-die refresh commands 212 below with reference to FIGS. 5-7.

The timings of the various self-refresh operations can also be controlled. The memory device 202 (e.g., the first die 204-1 thereof) can time refresh operations among the multiple dies 204-1 . . . 204-N to occur substantially simultaneously, partially overlapping, at different non-overlapping times, and combinations thereof. This document describes examples of refresh operation timings within a multi-die refresh cycle with reference to FIGS. 8-11. First, however, this document describes additional example aspects of the memory device 202.

Figure 3:
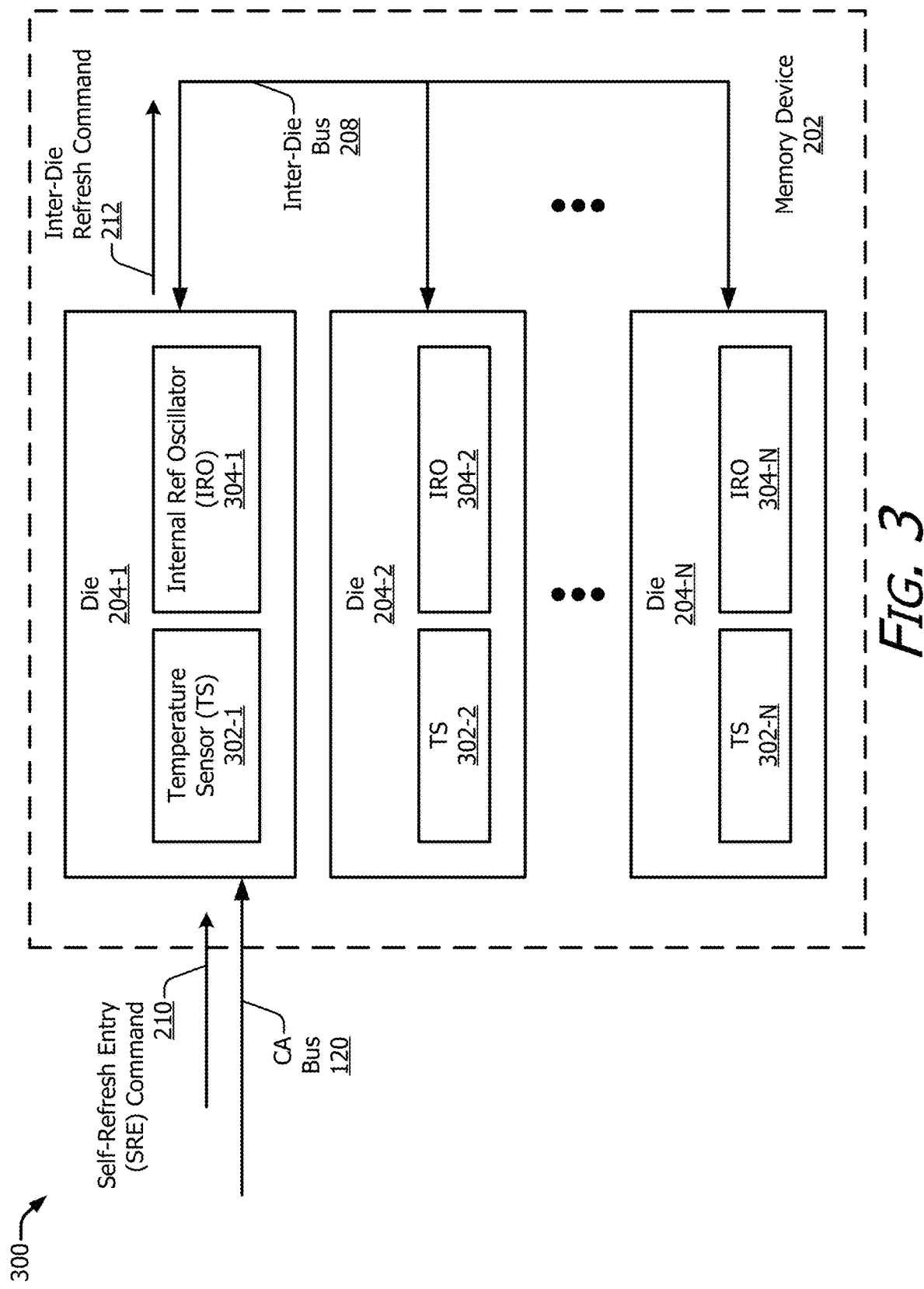
FIGS. 3 and 4 illustrate example implementations of the multiple dies of a memory device.
Figure 4:
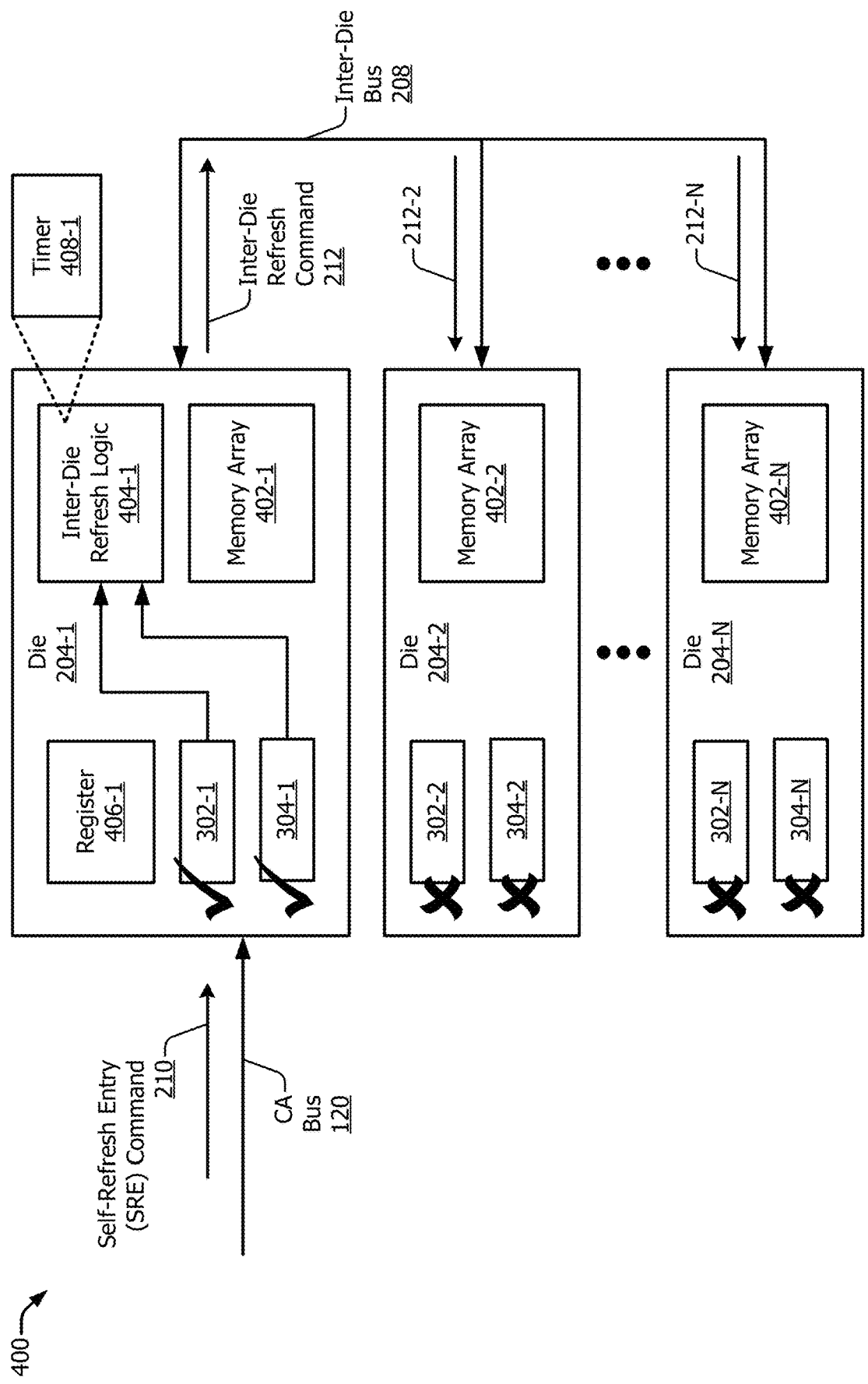

FIGS. 3 and 4 illustrate example implementations of multiple dies 204-1 . . . 204-N of a memory device 202. In FIG. 3, the memory device 202 is depicted as having the inter-die bus 208 internal to the memory device 202, such as within a package or disposed on a PCB of the memory device 202. The self-refresh entry command 210 is depicted propagating on the CA bus 120. As shown, the CA bus 120 is coupled to at least the first die 204-1. The first die 204-1 therefore receives the SRE command 210 via the CA bus 120 in this example. Any one or more of the other dies of the multiple dies 204-1 . . . 204-N, however, may also receive the SRE command 210 via the CA bus 120.

In example implementations, each respective die 204 of the multiple dies 204-1 . . . 204-N can include a respective temperature sensor 302 (TS 302) and a respective internal reference oscillator 304 (IRO 304). Thus, the first die 204-1 includes a first temperature sensor 302-1 and a first internal reference oscillator 304-1. Similarly, the second die 204-2 includes a second temperature sensor 302-2 and a second internal reference oscillator 304-2, and the "Nth" die 204-N includes an "Nth" temperature sensor 302-N and an "Nth" internal reference oscillator 304-N. Including a temperature sensor 302 and an internal reference oscillator 304 in each die 204 can simplify fabrication and engineering. Further, these components may be used for functions besides performing self-refresh operations. Alternatively, any of the second through the "Nth" dies 204-2 through 204-N can omit these two components to reduce area utilization on the respective die.

In example operations, at least the first die 204-1 uses the first temperature sensor 302-1 and the first internal reference oscillator 304-1 to determine or establish self-refresh timings. Generally, the internal reference oscillator 304 produces an oscillating signal (e.g., an internal clock signal) that can be used to track elapsing time. The elapsing time can establish a timer, such as a countdown timer or count-up timer. The temperature sensor 302 can be used to adjust the timer length to accommodate for changes to oscillation rates or for changes to charge loss rate in the DRAM bit cells due to ambient or operational temperature fluctuations. As described below, the first die 204-1 can use a timer to establish a start time for each multi-die refresh cycle for the multiple refresh operations spanning the multiple dies 204-1 . . . 204-N. The first die 204-1 can use another timer, or the same timer, to establish delays between successive refresh operations by successive dies within a given multi-die refresh cycle.

FIG. 4 depicts additional example components that can be included in at least one die 204 of the multiple dies 204-1 . . . 204-N of a memory device 202. As shown, each respective die 204 of the multiple dies 204-1 . . . 204-N includes a respective memory array 402 of multiple memory arrays 402-1, 402-2, . . . , 402-N. Thus, the first die 204-1 includes a first memory array 402-1. Similarly, the second die 204-2 includes a second memory array 402-2, and the "Nth" die 204-N includes an "Nth" memory array 402-N. Each memory array 402 can include volatile memory cells, such as those of DRAM, that are refreshed from time to time (e.g., periodically) to maintain the integrity of information stored therein.

In example implementations, at least the first die 204-1 includes inter-die refresh logic 404-1 and at least one register 406-1. Although these two components are illustrated in FIG. 4 and described herein with regard to the first die 204-1, either or both such components can be disposed in and utilized by one or more other dies of the multiple dies 204-1 . . . 204-N. The register 406-1 can store at least one configuration setting for inter-die refresh control. The one or more register configuration settings can specify timings; which die is the master; an order, signaling scheme, or approach for transmitting multiple inter-die refresh commands 212 during a multi-die refresh cycle; and so forth. The register configuration settings can be hard-coded into the circuitry during fabrication, stored during testing and tuning as part of manufacturing and production, programmed by software during use, and so forth. The inter-die refresh logic 404-1 can instantiate or operate at least one timer 408-1 for establishing timings for the inter-die refresh control as described herein.

As shown in FIG. 4, the first temperature sensor 302-1 can provide a sensed temperature value to the inter-die refresh logic 404-1. The first internal reference oscillator 304-1 can provide an oscillating signal to the inter-die refresh logic 404-1. The inter-die refresh logic 404-1 can therefore use the oscillating signal and the temperature value to create or operate the timer 408-1. Because of physical proximity and some common utilization patterns, each die 204 may experience comparable temperatures. The sensed temperature value from the first temperature sensor 302-1 may therefore be used to control refresh operation timings across the multiple dies 204-1 . . . 204-N.

In example operations, the first die 204-1 operates the first temperature sensor 302-1 and the first internal reference oscillator 304-1 as indicated by the "check marks," which also represent that these components are powered. In contrast, to conserve power, the temperature sensors 302 and the internal reference oscillators 304 of the other dies of the second through the "Nth" multiple dies 204-1 . . . 204-N can be depowered (e.g., disconnected from power). This depowering can occur during at least part of the self-refresh mode that the multiple dies 204-1 . . . 204-N enter. The inter-die refresh logic 404-1 issues the inter-die refresh command 212 based on the timer 408-1, such as responsive to expiration of a time period or duration. The inter-die refresh logic 404-1 can also trigger a self-refresh operation by the first die 204-1 with respect to the first memory array 402-1.

Under the control of the inter-die refresh logic 404-1, the first die 204-1 transmits the inter-die refresh command 212 onto the inter-die bus 208. The inter-die refresh command 212 initiates a cascade of refresh operations across the multiple dies 204-2 . . . 204-N based on at least one inter-die refresh command 212. For example, the second die 204-2 receives an inter-die refresh command 212-2, and the "Nth" die 204-N receives an inter-die refresh command 212-N. These may be the same or different commands as described herein. Example schemes for generating, distributing, or propagating these various inter-die refresh commands 212 are described below with reference to FIGS. 5-7. In response to receiving a given inter-die refresh command 212, each die 204 performs a self-refresh operation. For example, the second die 402-2 performs a self-refresh operation on the second memory array 402-2, and the "Nth" die 402-N performs a self-refresh operation on the "Nth" memory array 402-N.

Figure 5:
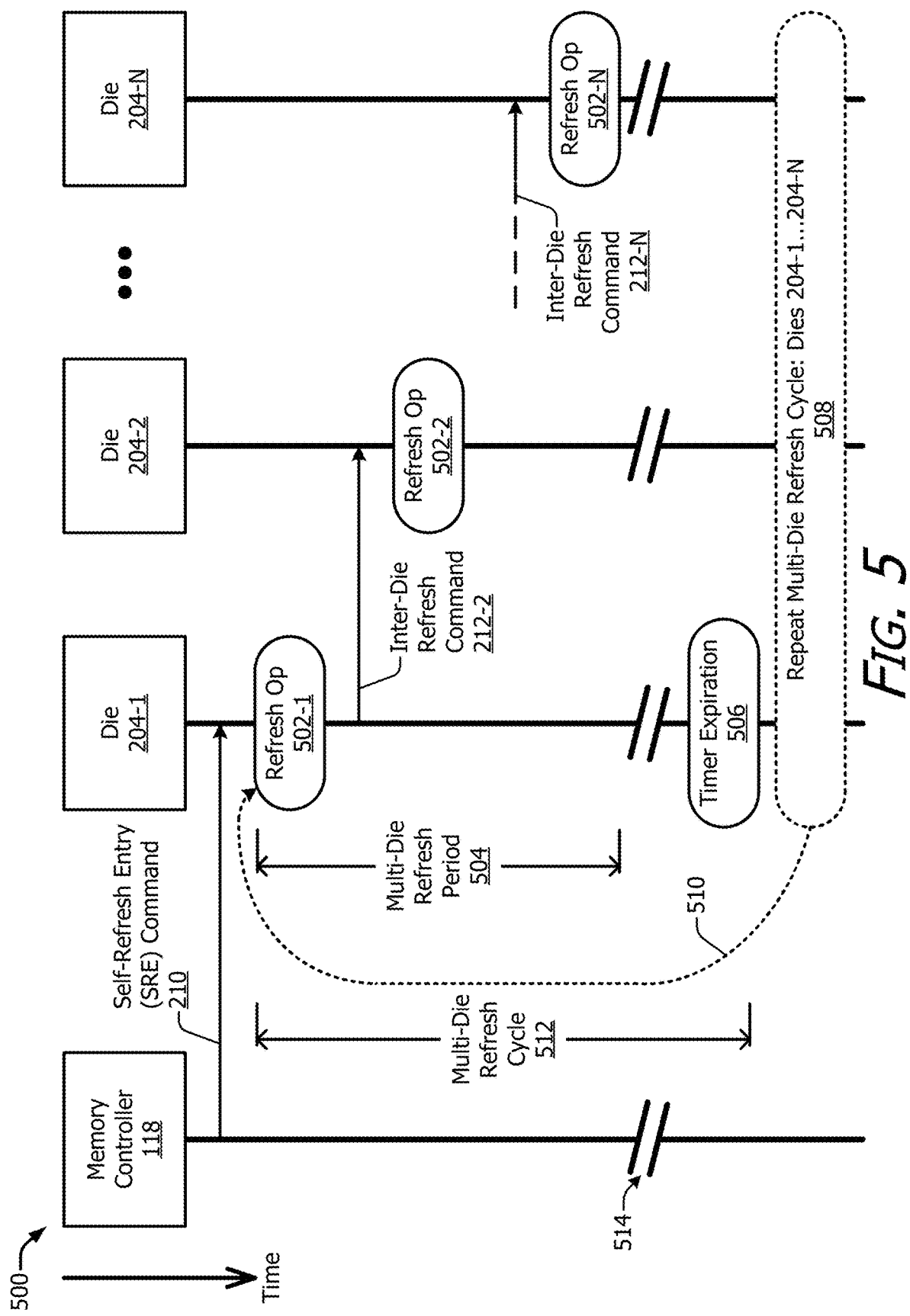
FIG. 5 illustrates a sequence diagram depicting an example signaling scheme for communicating inter-die refresh commands with multiple dies of a memory device.

FIG. 5 illustrates a sequence diagram 500 depicting an example signaling scheme for communicating inter-die refresh commands 212 with multiple dies 204-1 . . . 204-N of a memory device. The sequence diagram 500 also includes the memory controller 118. For the sequence diagram 500, time elapses in a downward direction. To start the self-refresh mode, the memory controller 118 transmits a self-refresh entry command 210 to the first die 204-1 via the CA bus 120 (e.g., of FIGS. 1, 3, and 4). The first die 204-1 receives the SRE command 210 from the memory controller 118 and enters the self-refresh mode in response. The other dies 204 may also receive the SRE command 210 to enter the self-refresh mode. During each multi-die refresh cycle 512, each die 204 of the multiple dies 204-1 . . . 204-N performs a refresh operation 502 on a respective memory array 402 (of FIG. 4).

From the perspective of the memory controller 118, the refresh operation 502 corresponds to a "self-refresh operation" because the memory controller 118 is not sending auto-refresh commands to cause the dies to refresh their memory arrays. From the perspective of the multiple dies 204-1 . . . 204-N, however, this refresh operation 502 may correspond to an "inter-die refresh operation" because such refresh operations are coordinated across multiple dies and because at least some dies do not independently control a timing of these operations.

In example implementations, the first die 204-1 performs a first refresh operation 502-1. The first die 204-1 also transmits the inter-die refresh command 212-2 to the second die 204-2 to trigger an internal refresh operation. The second die 204-2 receives the inter-die refresh command 212-2. Accordingly, in response to the inter-die refresh command 212-2, the second die 204-2 performs a second refresh operation 502-2 on a memory array thereof. This transmission of one or more inter-die refresh commands 212 and cascade of multiple refresh operations continues to the "Nth" die 204-N. The "Nth" die 204-N receives the inter-die refresh command 212-N from another die 204. In response to receiving the inter-die refresh command 212-N, the "Nth" die 204-N performs an "Nth" refresh operation 502-N on a memory array thereof. The origin of the inter-die refresh command 212-N may depend on which inter-die refresh control signaling scheme is deployed by the memory device or the multiple dies 204-1 . . . 204-N thereof. Example signaling schemes are described below with reference to FIGS. 6 and 7.

When each of the "N" dies 404 of the multiple dies 204-1, 204-2, . . . , 204-N has completed a respective refresh operation 502 of "N" refresh operation 502-1, 502-2, . . . , 502-N, an amount of time that has elapsed corresponds to a multi-die refresh period 504. Using the timer 408-1 (of FIG. 4), the inter-die refresh logic 404-1 of the first die 204-1 monitors an elapsed time. The elapsed time can be established to balance the power consumption of a refresh operation, as well as potential system latency when exiting from a self-refresh mode, against the discharge rate of the capacitors of the volatile memory cells. Determination of an appropriate elapsed time can thus consider a sensed temperature value, which affects the discharge rate. The longer is the elapsed time between consecutive refreshes for a given memory array, the lower the power consumption and the lower the system impact caused by the refresh operations.

After the time period elapses, the inter-die refresh logic 404-1 of the first die 204-1 detects a timer expiration 506, which defines or determines the multi-die refresh cycle 512. Responsive to the detected timer expiration 506, the multi-die refresh period 504 is restarted as part of another multi-die refresh cycle 512 (as shown at 508) to cause a respective refresh operation 502 to be performed in each respective die 204. The first die 204-1 therefore issues another inter-die refresh command 212-2 for the second die 204-2. Accordingly, the multi-die refresh period 504 is restarted for the multiple dies 204-1 . . . 204-N, and the longer time period is restarted for the multi-die refresh cycle 512, as indicated at arrow 510. As indicated by the double lines 514 which represent a time break, the time period for the multi-die refresh cycle 512 may appreciably exceed a length of time or duration corresponding to the multi-die refresh period 504.

Figure 6:
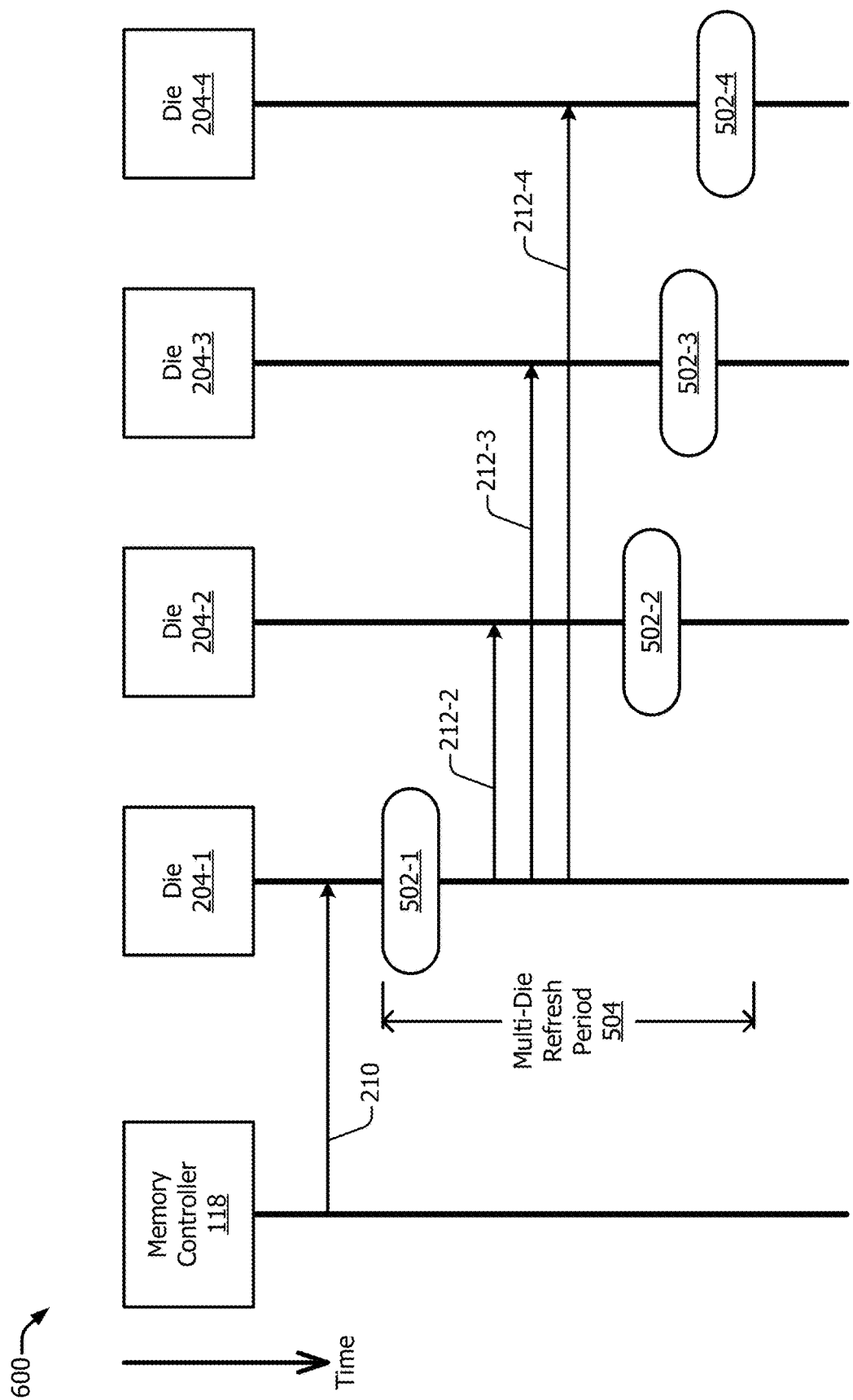
FIGS. 6 and 7 illustrate sequence diagrams depicting other example signaling schemes for communicating inter-die refresh commands with multiple dies of a memory device.
Figure 7:
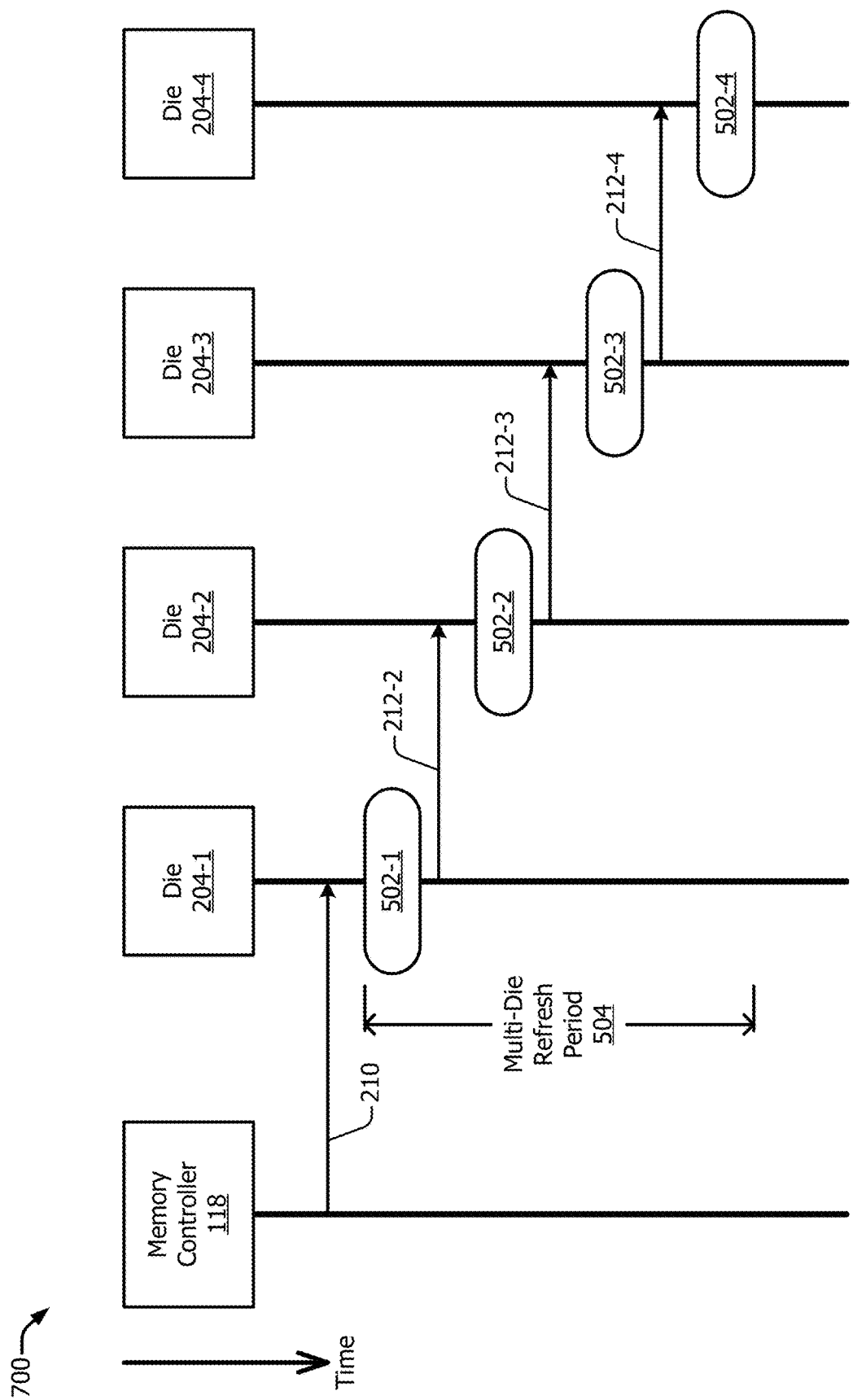

FIGS. 6 and 7 illustrate sequence diagrams 600 and 700, respectively, depicting additional example signaling schemes for communicating inter-die refresh commands 212 with multiple dies 204-1 . . . 204-N of a memory device. Both sequence diagrams 600 and 700 include the memory controller 118 and the multiple dies 204-1 . . . 204-N, with "N=4" for clarity in these examples. Nonetheless, the principles are applicable to "N" dies. With the signaling scheme of the sequence diagram 600, the first die 204-1 issues the one or more inter-die refresh commands 212 to the exclusion of other dies. With the signaling scheme of the sequence diagram 700, on the other hand, the first die 204-1 issues at least one inter-die refresh command 212, but at least one other die 204 also issues at least one inter-die refresh command 212.

In FIG. 6, the first die 204-1 transmits at least one inter-die refresh command 212 to multiple other dies of the multiple dies 204-1 . . . 204-4. As shown, the first die 204-1 transmits a respective inter-die refresh command 212 to each other respective die 204 of the multiple dies 204-1 . . . 204-4. Specifically, the first die 204-1 transmits an inter-die refresh command 212-2 to the second die 204-2 via the inter-die bus 208 (e.g., of FIGS. 2-4). Similarly, the first die 204-1 transmits an inter-die refresh command 212-3 to the third die 204-3 via the inter-die bus 208, and the first die 204-1 transmits an inter-die refresh command 212-4 to the fourth die 204-4 via the inter-die bus 208. Each respective inter-die refresh command 212-2, 212-3, and 212-4 triggers a respective refresh operation 502-2, 502-3, and 502-4 in the respective die 204-2, 204-3, and 204-4.

Although the sequence diagram 600 depicts the first die 204-1 transmitting three "separate" inter-die refresh commands 212 to the three remaining dies 204-2 to 204-4, the signaling can be accomplished differently. For instance, the first die 204-1 may transmit each inter-die refresh command 212 to multiple dies but less than all four of the dies in this example. Alternatively, the first die 204-1 can transmit a single inter-die refresh command 212 simultaneously to each of the other three dies that are on the inter-die bus 208 in this four-die example. The timings of the inter-die refresh commands 212 can also differ from the depicted timings. For instance, the first die 204-1 can transmit the inter-die refresh command 212-2 before completing the first refresh operation 502-1.

In FIG. 7, the first die 204-1 transmits at least one inter-die refresh command 212 to at least one other die of the multiple dies 204-1 . . . 204-4. In contrast with the sequence diagram 600, in the sequence diagram 700, at least one other die 204 also transmits at least one inter-die refresh command 212. In the example depicted in the sequence diagram 700, a respective die 204 (except for the fourth die 204-4) transmits a respective inter-die refresh command 212 to one other die of the multiple dies 204-2 . . . 204-4. The first die 204-1 transmits an inter-die refresh command 212-2 to the second die 204-2. The second die 204-2 receives the inter-die refresh command 212-2. In response, the second die 204-2 performs the refresh operation 502-2 and transmits an inter-die refresh command 212-3 to the third die 204-3.

In response to receiving the inter-die refresh command 212-3, the third die 204-3 initiates the refresh operation 502-3 for its memory array. Further, the third die 204-3 transmits an inter-die refresh command 212-4 to the fourth die 204-4. The fourth die 204-4 receives the inter-die refresh command 212-4 and performs the refresh operation 502-4 in response to the receipt. The timings of a multi-die refresh period 504 can differ from those that are depicted. For instance, a given die 204 can transmit an inter-die refresh command 212 to a succeeding die 204 before the given die completes (or even starts) a refresh operation 502. Other signaling schemes may be implemented instead of those illustrated in the sequence diagrams 500, 600, and 700. In some cases, the signaling schemes may be combined. For example, multiple dies 204 may transmit multiple inter-die refresh commands 212. In one instance, a first die may transmit two inter-die refresh commands 212, one each to second and third dies sequentially or simultaneously. The third die, in turn, may transmit two inter-die refresh command 212, one each to fourth and fifth dies.

FIGS. 8, 9, 10, and 11 respectively illustrate simplified timing diagrams 800, 900, 1000, and 1100 depicting example timing approaches for implementing refresh operations across multiple dies 204-1 . . . 204-N of a memory device within each multi-die refresh cycle 512 (e.g., of FIG. 5). The simplified timing diagrams depict elapsing time in the rightward direction along multiple time slots. Each timeslot (TS) can correspond to a duration to perform a refresh operation 502. Each refresh operation 502 can represent any type of multiple types of refresh operations, including an all-bank refresh operation or a per-bank refresh operation.

The simplified timing diagrams 800, 900, 1000, and 1100 also depict multiple dies 204-1 . . . 204-N vertically along the left of each drawing. Specifically, a first die 204-1, a second die 204-2, a third die 204-3, a fourth die 204-4, . . . , an "(N−1)th" die 204-(N−1), and an "Nth" die 204-N are shown. Each respective die 204 of the multiple dies 204-1 . . . 204-N performs a respective refresh operation 502 of multiple refresh operations 502-1 . . . 502-N. Specifically, a first refresh operation 502-1, a second refresh operation 502-2, a third refresh operation 502-3, a fourth refresh operation 502-4, . . . , an "(N−1)th" refresh operation 502-(N−1), and an "Nth" refresh operation 502-N are shown. Thus, the third die 204-3 performs the third refresh operation 502-3 during some timeslot, and the "Nth" die 204-N performs the "Nth" refresh operation 502-N during some timeslot. These can be the same timeslot, different timeslots, overlapping timeslots, and so forth, as is described next.

Generally, the timing diagram 800 depicts full simultaneous performance of the multiple refresh operations 502-1 . . . 502-N in a single timeslot (TS). The timing diagram 900 shows partial simultaneous performance in which a subset (e.g., two) of the total quantity "N" of refresh operations 502 are performed during any given timeslot. The timing diagram 1000 illustrates an approach with no simultaneous refreshes in which each refresh operation is allocated its own timeslot. The timing diagram 1100 is a hybrid timing approach in which at least some refresh operations 502 partially overlap at least one other refresh operation.

Figure 8:
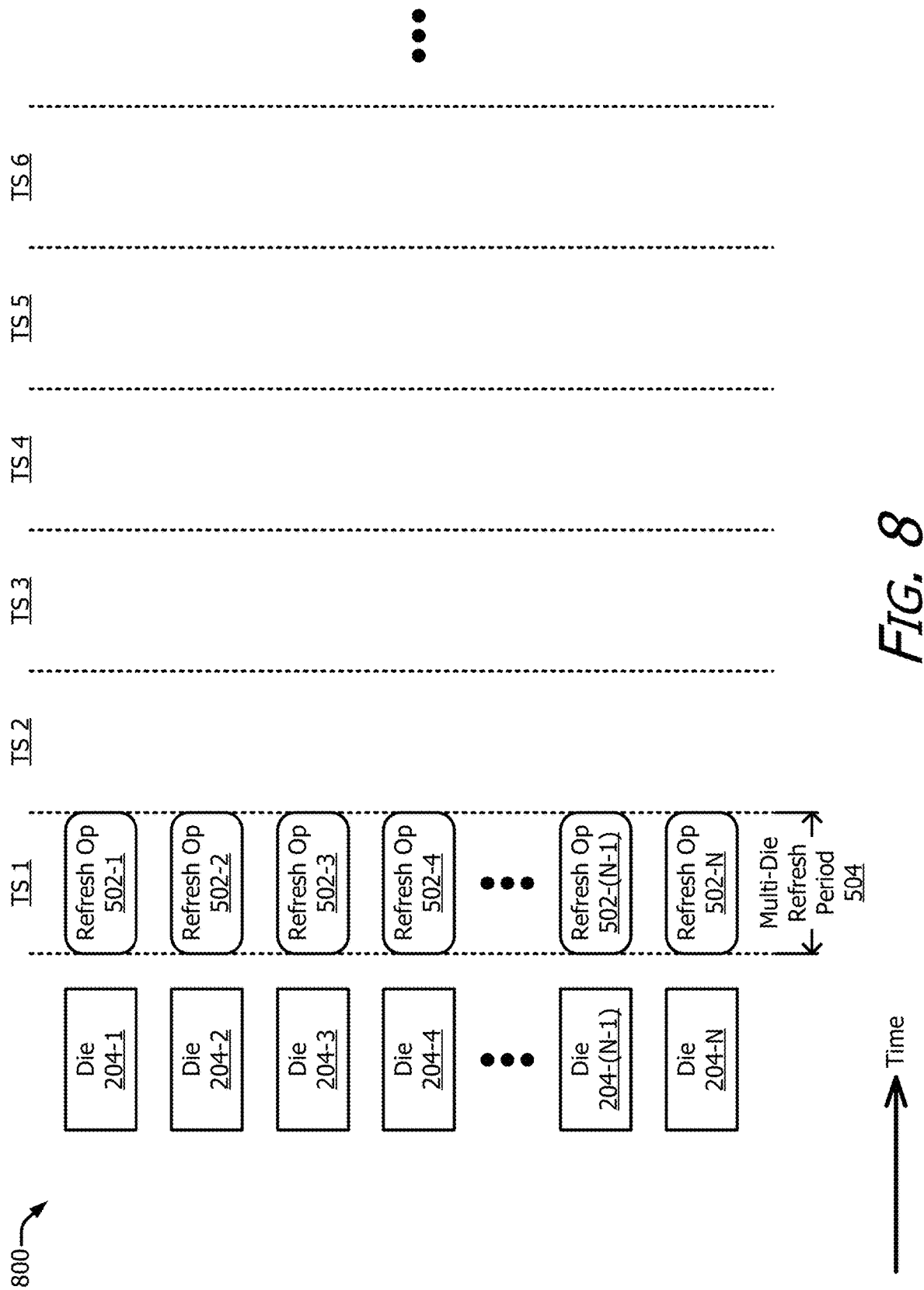
FIGS. 8-11 illustrate simplified timing diagrams depicting example timing approaches for implementing refresh operations across multiple dies of a memory device within each multi-die refresh cycle.

In example implementations, the timing diagram 800 of FIG. 8 depicts a timing approach in which the multiple refresh operation 502-1 . . . 502-N are performed during a same timeslot, which is the first timeslot (TS 1) as illustrated. In this timing approach, the first die 204-1 can, for example, transmit a same inter-die refresh command 212 to each of the other dies of the multiple dies 204-1 . . . 204-N. Accordingly, each die 204 of the multiple dies 204-1 . . . 204-N can start its respective refresh operation 502 of the multiple refresh operations 502-1 . . . 502-N at substantially the same time. Due to signal and processing latency, however, each refresh operation 502 may start at slightly different times in a physical circuit.

With each refresh operation 502 starting at substantially the same time, the multi-die refresh period 504 extends for approximately one timeslot. By coordinating the multiple refresh operations 502-1 . . . 502-N into a single timeslot, adverse performance impacts due to delays when the self-refresh mode is terminated are reduced. In other words, the likelihood that a refresh operation 502 is in-progress when the memory controller 118 next wants to access the memory device 202 is lower by concentrating the multiple refresh operations 502-1 . . . 502-N in time.

Each refresh operation 502, however, draws power from a system or circuitry thereof, such as a power management integrated circuit (PMIC). The PMIC may be located on the memory device 202 or on a different component. Regardless, the PMIC provides a finite amount of power, and refresh operations draw an appreciable current. Consequently, some systems may be unable to safely provide sufficient power for all refresh operations, or even for any refresh operations, to be performed simultaneously. In such cases, the timings of the multiple refresh operations 502-1 . . . 502-N may be staggered to temporally disperse the power draws. An example timing approach in which no refresh operations 502 are overlapped is described below with reference to FIG. 10. First, however, a timing approach that may result from a PMIC that can power multiple, but not all, refresh operations simultaneously is described next with reference to FIG. 9.

Figure 9:
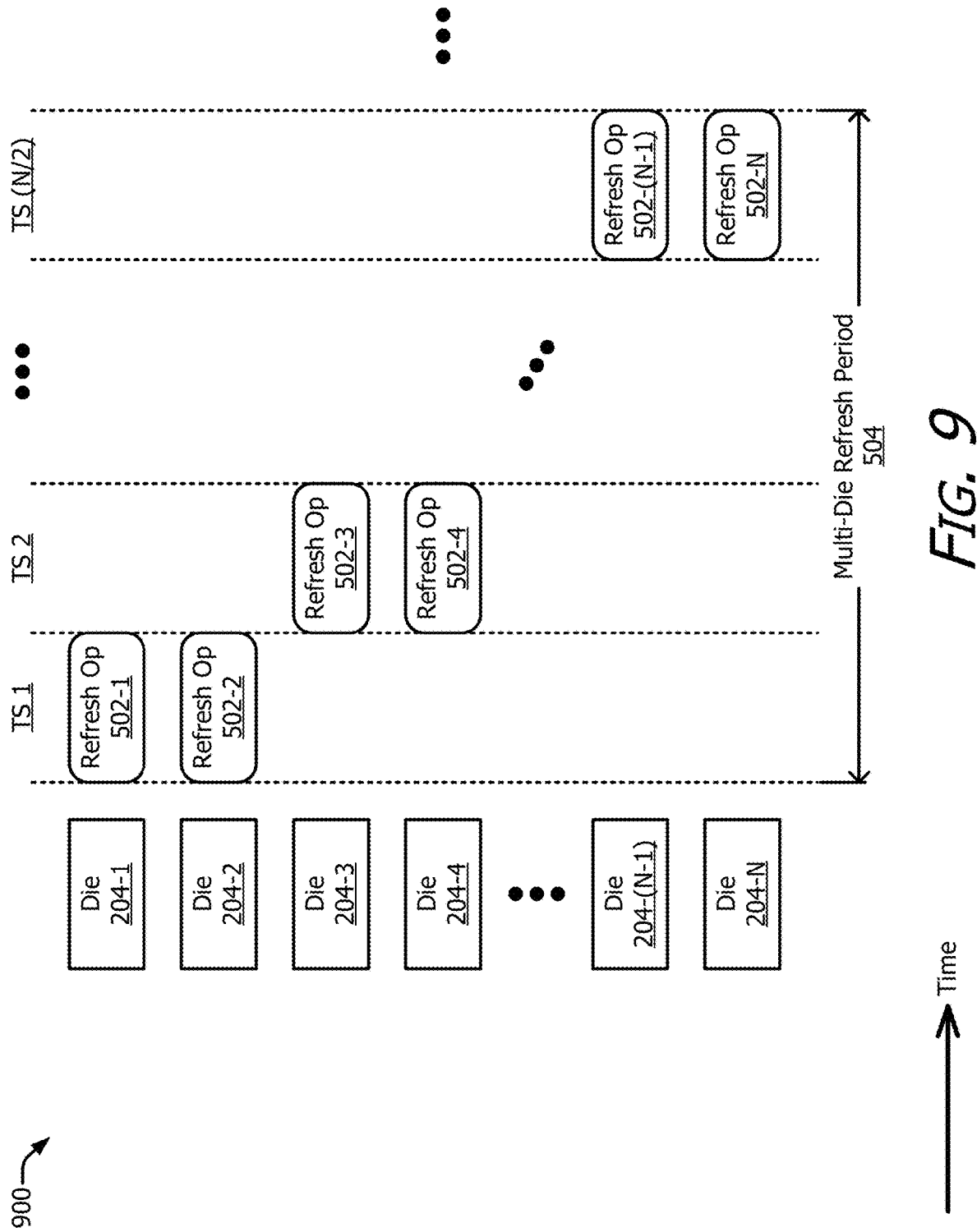

In example implementations, the timing diagram 900 of FIG. 9 depicts a timing approach in which the multiple refresh operation 502-1 . . . 502-N are handled in two different ways. Each refresh operation 502 is performed in parallel with at least one other refresh operation 502, but the multiple refresh operations 502-1 ... 502-N are still distributed across different timeslots. In the illustrated example, the associated PMIC can power two refresh operations 502 simultaneously, so two are performed in each timeslot (TS). With two refresh operations 502 of the "N" refresh operations 502-1 ... 502-N being performed per timeslot (TS), the multiple refresh operations 502-1 ... 502-N extend from the first timeslot (TS 1) to an "(N/2)th" timeslot (TS N/2). Thus, the multi-die refresh period 504 corresponds to (N/2) timeslots. In other analogous timing approaches, three or more refresh operations 502 may be performed per timeslot to further reduce the duration of the multi-die refresh period 504, if the PMIC can satisfy higher power draws.

Figure 10:
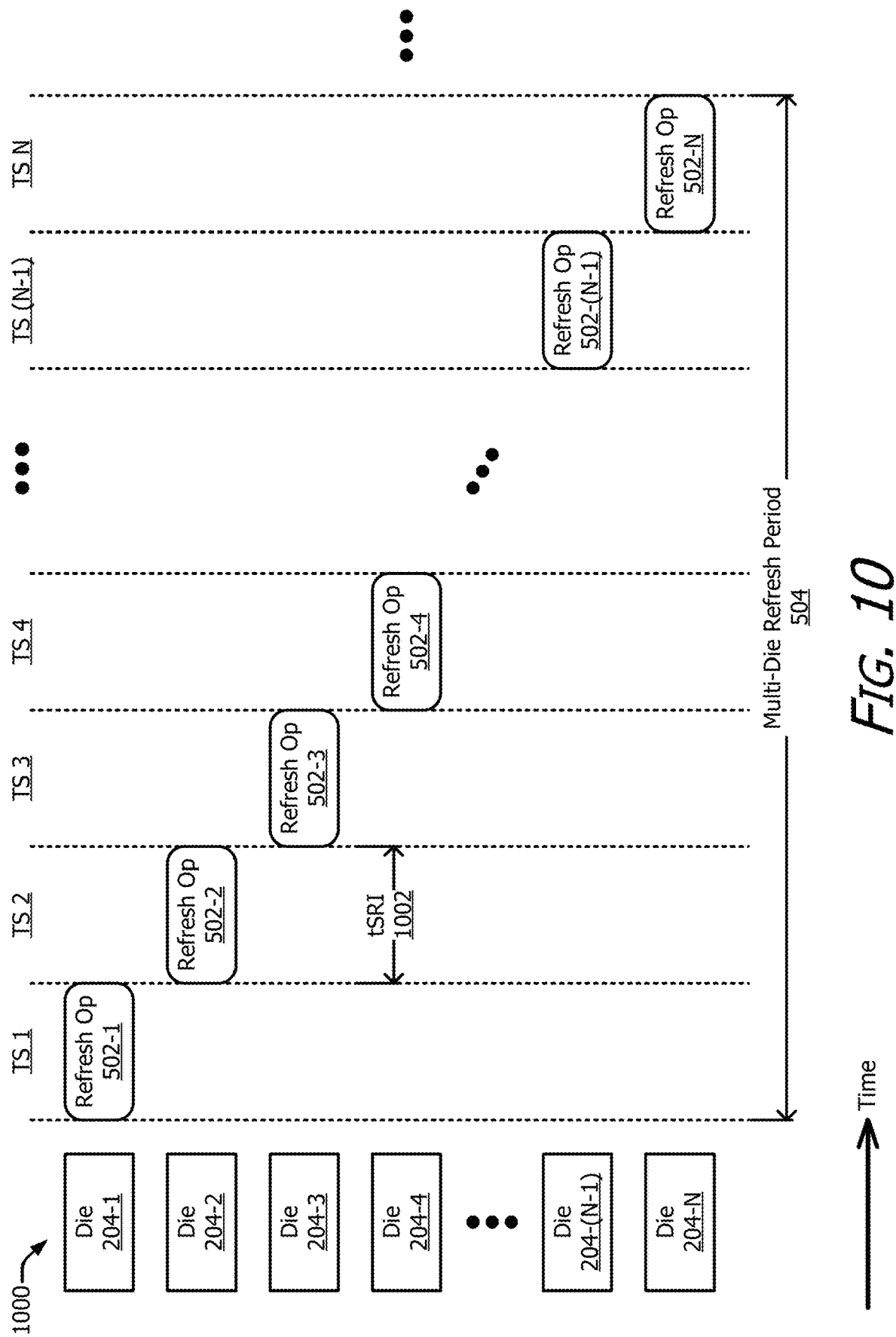

In example implementations, the timing diagram 1000 of FIG. 10 depicts a timing approach in which the multiple refresh operations 502-1 ... 502-N are performed during different timeslots, such as from the first timeslot (TS 1) to an "Nth" timeslot (TS N). Thus, each respective die 204 of the multiple dies 204-1 ... 204-N performs a respective refresh operation 502 of the multiple refresh operations 502-1 ... 502-N at a respective timeslot (TS) of multiple timeslots (TS 1 ... TS N). In this way, no refresh operation 502 need overlap any other refresh operation 502. This timing approach may be implemented in systems in which the PMIC is unable to support the occurrence of even two simultaneous refresh operations 502.

With the example timing approach of the timing diagram 1000, a self-refresh interval time (tSRI) 1002 corresponds to a duration of each timeslot (TS). The self-refresh interval time 1002 reflects a duration between the starts of consecutive or successive refresh operations 502 of two dies 204. An example self-refresh interval time 1002 (tSRI 1002) is depicted between a start time of the refresh operation 502-2 of the second die 204-2 and a start time of the refresh operation 502-3 of the third die 204-3. For this timing approach, the multi-die refresh period 504 corresponds to "N" timeslots (TS 1 to TS N) and "N" self-refresh interval times 1002, or N*tSRI.

Figure 11:
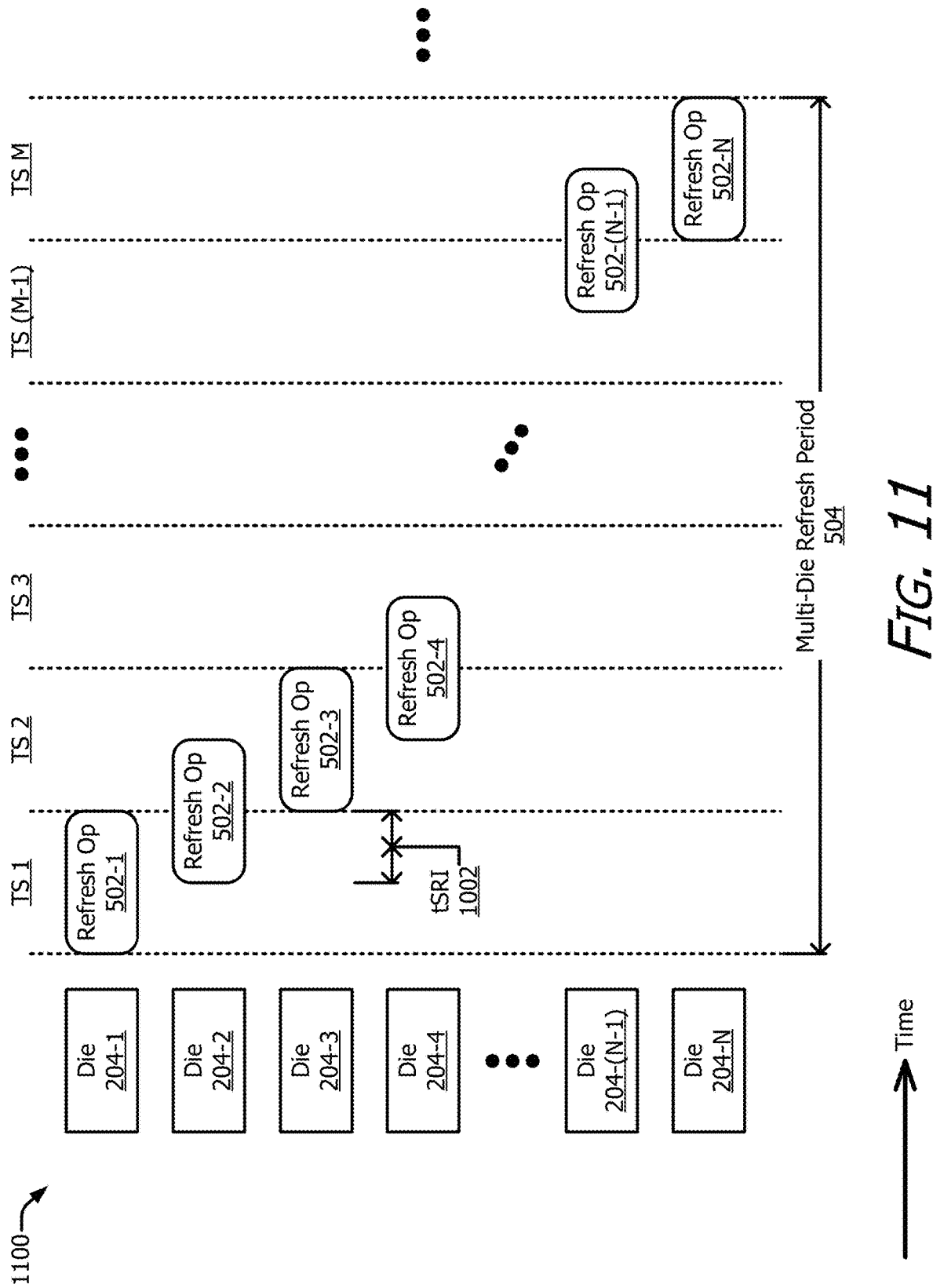

In example implementations, the timing diagram 1100 of FIG. 11 depicts a timing approach in which the multiple refresh operations 502-1 ... 502-N are performed in a partially overlapping manner. In this case, a quantity of refresh operations 502 that can be simultaneously performed across the multiple dies 204-1 ... 204-N is constrained by the PMIC (or another component or factor) to some degree. The power drawn by a given die 204 throughout a refresh operation 502 is not, however, constant. Instead, the power draw may be greater during an initial portion of each refresh operation 502. This initial portion may include activating and pre-charging one or more rows of the memory array 402. Upon the conclusion of this initial portion of a first refresh operation 502, a next or succeeding refresh operation 502 can be initiated, even before the first refresh operation 502 is completed.

This is shown in FIG. 11 as each given refresh operation 502 is overlapped partially by the next successive refresh operation 502. For example, while the second die 204-2 is performing the refresh operation 502-2, the third die 204-3 starts performing the refresh operation 502-3. A time duration between starts of the two temporally adjacent, or successive, refresh operations 502-2 and 502-3 is indicated as the self-refresh interval time 1002 (tSRI 1002). Like for the timing diagram 1000 of FIG. 10, the multi-die refresh period 504 corresponds to "N" self-refresh interval times 1002, or N*tSRI. Each self-refresh interval time 1002 for the timing diagram 1100, however, is shorter than each self-refresh interval time 1002 for the timing diagram 1000 due to the overlapping of refresh operations 502 in FIG. 11.

As shown, the timeslots span across a first timeslot (TS 1), a second timeslot (TS 2), a third timeslot (TS3), ... , an "(M−1)th" timeslot (TS (M−1)), and an "Mth" timeslot (TS M), where "M" is a positive integer greater than one. The value of "M" depends on the length of each timeslot and the length of the self-refresh interval time 1002. In other words, the value of "M" is dependent on the relative lengths of each refresh operation 502 and the duration of the self-refresh interval time 1002.

The signaling schemes of FIGS. 5-7 and the timing approaches of FIGS. 8-11 can be combined in various manners. For example, the timing approaches of FIGS. 9 and 11 can be combined such that one set of two (or more) simultaneously performed refresh operations 502 partially overlap another set of two simultaneously performed refresh operations over a multi-die refresh period 504. As another example, the signaling scheme of FIG. 6 in which the first die 204-1 sends out separate inter-die refresh commands 212 can be combined with the staggered refresh timing of FIG. 10 using the timer 408-1 of the first die 204-1. As yet another example, the overlapping timing of FIG. 11 can be combined with the signaling scheme of FIG. 7 by using a timer in each die 204 or by including inter-die refresh logic 404 in each die that transmits an inter-die refresh command 212 to a succeeding die at a given stage of a refresh operation (e.g., after activation and precharge) of a memory array that is being refreshed in the die 204.

Example Methods

Figure 12:
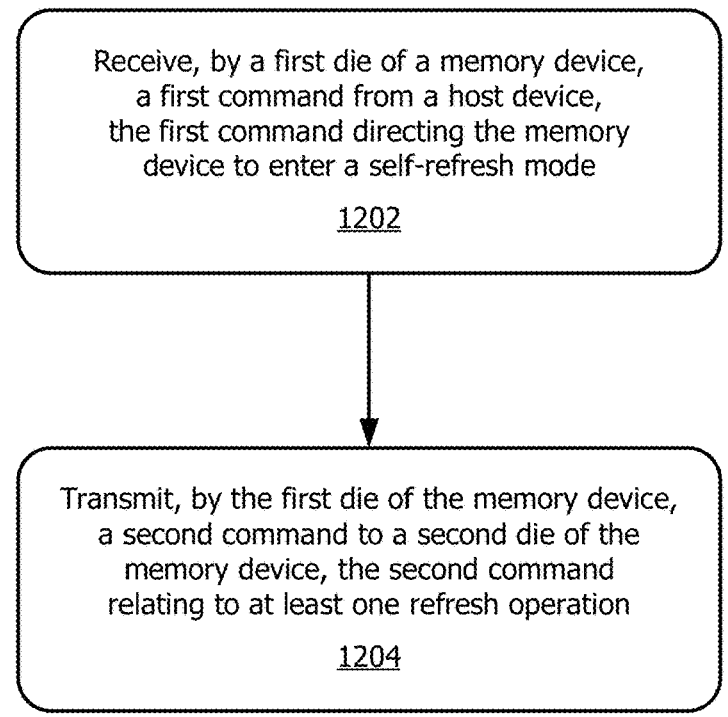
FIG. 12 illustrates a flow diagram depicting example methods for inter-die refresh control.
Figure 13:
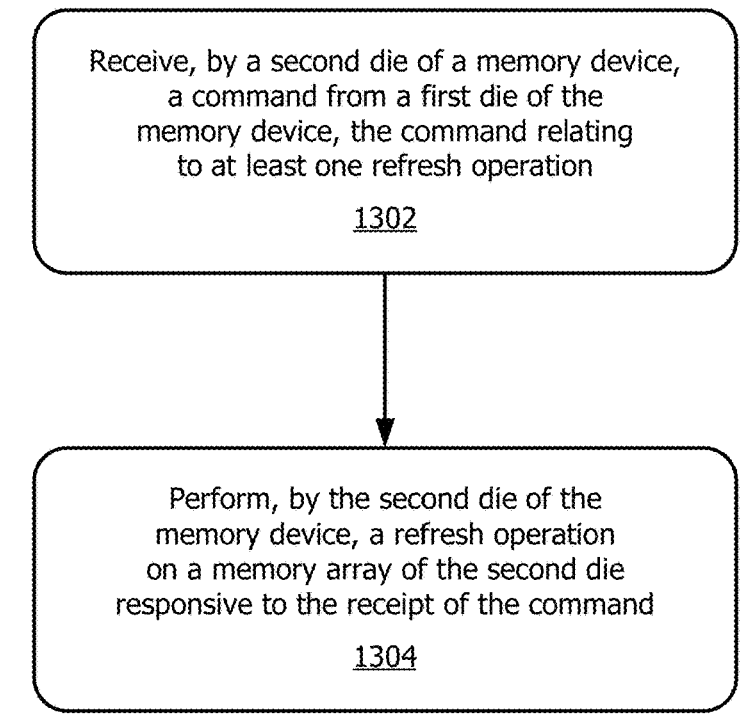
FIG. 13 illustrates a flow diagram depicting other example methods for inter-die refresh control.

Example methods are described in this section with reference to the flow charts or flow diagrams of FIGS. 12 and 13. These descriptions reference components, entities, and other aspects depicted in FIGS. 1-11 by way of example only. FIG. 12 illustrates a flow diagram 1200 depicting example methods for inter-die refresh control. The flow diagram 1200 includes two blocks 1202 and 1204.

At block 1202, a first die of a memory device receives a first command from a host device, with the first command directing the memory device to enter a self-refresh mode. For example, a first die 204-1 of a memory device 202 can receive a first command from a host device 104, with the first command directing the memory device 202 to enter a self-refresh mode. To do so, the first die 204-1 of multiple dies 204-1 ... 204-N of the memory device 202 may receive the first command from a memory controller 118 of the host device 104 via a command and address bus 120 (CA bus 120). The first command may comprise, for instance, a self-refresh entry command 210 (SRE command 210).

At block 1204, the first die of the memory device transmits a second command to a second die of the memory device, with the second command relating to at least one refresh operation. For example, the first die 204-1 of the memory device 202 can transmit a second command to a second die 204-2 of the memory device 202, with the second command relating to at least one refresh operation. In some cases, the first die 204-1 may transmit the second command to the second die 204-2 via an inter-die bus 208 of the memory device 202. The inter-die bus 208 may be reserved for communications that remain in the memory device 202 or for communications that travel between two or more dies 204. The second command may comprise, for instance, an inter-die refresh command 212. The inter-die refresh command 212 may direct the second die 204-2 to perform a refresh operation 502-2 (e.g., to refresh a memory array 402-2 of the second die 204-2), to send a third command (e.g., another inter-die refresh command 212) to another die to prompt a refresh operation 502, some combination thereof, and so forth.

FIG. 13 illustrates a flow diagram 1300 depicting other example methods for inter-die refresh control. The flow diagram 1300 includes two blocks 1302 and 1304. At block 1302, a second die of a memory device receives a command from a first die of the memory device, with the command relating to at least one refresh operation. For example, a second die 204-2 of a memory device 202 can receive a command from a first die 204-1 of the memory device 202, with the command relating to at least one refresh operation 502. Here, the at least one refresh operation 502 may pertain to a refresh operation 502-2 to be performed by the second die 204-2 or to a refresh operation 502-X to be performed by another die 204-X with which the second die 204-2 is to communicate (with "X" representing an integer between three and "N"). The command may comprise, for instance, an inter-die refresh command 212-2.

At block 1304, the second die of the memory device performs a refresh operation on a memory array of the second die responsive to the receiving of the command. For example, the second die 204-2 of the memory device 202 can perform a refresh operation 502-2 on a memory array 402-2 of the second die 204-2 responsive to receipt of the command. Thus, refresh logic of the second die 204-2 may refresh cells of the memory array 402-2 responsive to receiving the inter-die refresh command 212-2.

For the flow charts and flow diagrams described above, the orders in which operations are shown and/or described are not intended to be construed as a limitation. Any number or combination of the described process operations can be combined or rearranged in any order to implement a given method or an alternative method. Operations may also be omitted from or added to the described methods. Further, described operations can be implemented in fully or partially overlapping manners.

Aspects of these methods may be implemented in, for example, hardware (e.g., fixed-logic circuitry or a processor in conjunction with a memory), firmware, software, or some combination thereof. The methods may be realized using one or more of the apparatuses or components shown in FIGS. 1 to 11, the components of which may be further divided, combined, rearranged, and so on. The devices and components of these figures generally represent hardware, such as electronic devices, packaged modules, IC chips, or circuits; firmware or the actions thereof; software; or a combination thereof. With reference to FIGS. 1-11, in some cases, a memory device 202 (or a die 204 thereof) or a host device 104 may individually perform the operations of described methods. In other cases, a memory device 202 and a host device 104 may jointly perform methods. Thus, these figures illustrate some of the many possible systems or apparatuses capable of implementing the described methods.

Examples of multiple implementations are described below.

Example 1: A method comprising: receiving, by a first die of a memory device, a first command from a host device, the first command directing the memory device to enter a self-refresh mode; and transmitting, by the first die of the memory device, a second command to a second die of the memory device, the second command relating to at least one refresh operation.

Example 2: The method of example 1, further comprising: receiving, by the first die of the memory device, the first command from a memory controller of the host device.

Example 3: The method of example 1 or example 2, further comprising: receiving, by the first die of the memory device, the first command from the host device via a control bus coupling the memory device to the host device.

Example 4: The method of any one of the preceding examples, wherein the control bus comprises a command and address bus that comports with at least one low-power double data rate (LPDDR) memory standard.

Example 5: The method of any one of the preceding examples, further comprising: entering, by the first die of the memory device, the self-refresh mode responsive to the receiving the first command.

Example 6: The method of any one of the preceding examples, further comprising: refreshing, by the first die of the memory device, a memory array of the first die based on a timing that is generated internally by the first die responsive to the entering of the self-refresh mode.

Example 7: The method of any one of the preceding examples, further comprising: transmitting, by the first die of the memory device, the second command to the second die of the memory device using an inter-die bus that couples the first die to the second die.

Example 8: The method of any one of the preceding examples, further comprising: transmitting, by the first die of the memory device, the second command to a third die of the memory device.

Example 9: The method of any one of the preceding examples, further comprising: transmitting, by the first die of the memory device, a third command to a third die of the memory device, the third command relating to at least one refresh operation, wherein the transmitting of the third command to the third die is performed after the transmitting of the second command to the second die.

Example 10: The method of any one of the preceding examples, further comprising: receiving, by the second die of the memory device, the second command from the first die of the memory device; and transmitting, by the second die of the memory device, a third command to a third die of the memory device responsive to the receiving of the second command, the third command relating to at least one refresh operation.

Example 11: The method of any one of the preceding examples, further comprising: receiving, by the second die of the memory device, the second command from the first die of the memory device; and refreshing, by the second die of the memory device, a memory array of the second die responsive to the receiving of the second command.

Example 12: The method of any one of the preceding examples, wherein the second command comprises at least one of an all-bank refresh command or a self-refresh command.

Example 13: The method of any one of the preceding examples, further comprising: initiating, by the first die of the memory device, a refresh operation of a memory array of the first die responsive to the first command; determining that a time period has expired, a start of the time period relating to the initiating of the refresh operation of the memory array of the first die; and transmitting, by the first die of the memory device, the second command to the second die of the memory device responsive to the determining.

Example 14: The method of any one of the preceding examples, wherein the time period comprises a self-refresh interval time between starts of successive refresh operations across multiple dies of the memory device, the multiple dies including the first die and the second die.

Example 15: The method of any one of the preceding examples, further comprising: determining that a time period has expired, a start of the time period corresponding to a refresh operation performed on a memory array of the first die; and performing, by the first die of the memory device, another refresh operation on the memory array of the first die responsive to the determining.

Example 16: The method of any one of the preceding examples, further comprising: transmitting, by the first die of the memory device, a third command to the second die of the memory device responsive to the determining, the third command relating to at least one refresh operation.

Example 17: The method of any one of the preceding examples, wherein the time period comprises a self-refresh interval between successive memory array refreshes within a given die of the memory device.

Example 18: An apparatus comprising: a second die of a memory device; and a first die of the memory device, the first die coupled to the second die, the first die configured to: receive a first command from a host device, the first command directing the memory device to enter a self-refresh mode; and transmit a second command to the second die of the memory device responsive to receipt of the first command, the second command relating to at least one refresh operation.

Example 19: The apparatus of example 18, further comprising: an interconnect coupled to the first die; and the host device, the host device including a memory controller that is coupled to the interconnect, the memory controller configured to: transmit the first command to the first die using the interconnect.

Example 20: The apparatus of example 18 or example 19, further comprising: the memory device, the memory device including: multiple dies, the multiple dies including the first die and the second die; and at least one inter-die bus coupled to each die of the multiple dies.

Example 21: The apparatus of any one of examples 18-20, wherein the first die is configured to transmit the second command to the second die via the inter-die bus.

Example 22: The apparatus of any one of examples 18-21, wherein the inter-die bus is separate from an interconnect coupling the memory device to the host device.

Example 23: The apparatus of any one of examples 18-22, wherein: the memory device comprises a memory module; and the inter-die bus is disposed internal to the memory module.

Example 24: The apparatus of any one of examples 18-23, wherein: the first die includes an internal reference oscillator; and the first die is configured to transmit multiple second commands over time to the second die based on one or more time periods determined using the internal reference oscillator, each second command of the multiple second commands directing the second die to perform a refresh operation on a memory array of the second die.

Example 25: The apparatus of any one of examples 18-24, wherein: the first die includes a temperature sensor; and the first die is configured to transmit the multiple second commands over time to the second die based on the one or more time periods determined using the temperature sensor.

Example 26: The apparatus of any one of examples 18-25, wherein: the second die includes an internal reference oscillator; at least part of the memory device is configured to enter the self-refresh mode responsive to the first command; and the second die is configured to depower the internal reference oscillator of the second die at least during the self-refresh mode of the memory device.

Example 27: The apparatus of any one of examples 18-26, further comprising: a third die of the memory device, wherein the second die is configured to: receive the second command from the first die; and transmit a third command to the third die of the memory device responsive to receipt of the second command, the third command relating to at least one refresh operation for the third die.

Example 28: The apparatus of any one of examples 18-27, further comprising: a third die of the memory device, wherein the first die is configured to transmit the second command to the third die of the memory device responsive to receipt of the first command.

Example 29: The apparatus of any one of examples 18-28, further comprising: a third die of the memory device, wherein the first die is configured to transmit a third command to the third die of the memory device responsive to receipt of the first command, the third command relating to at least one refresh operation of the third die.

Example 30: A method comprising: receiving, by a second die of a memory device, a command from a first die of the memory device, the command relating to at least one refresh operation; and performing, by the second die of the memory device, a refresh operation on a memory array of the second die responsive to the receiving of the command.

Example 31: The method of example 30, further comprising: transmitting, by the second die of the memory device, another command to a third die of the memory device responsive to the receiving of the command, the other command relating to at least one refresh operation of the third die.

Example 32: The method of example 30 or example 31, wherein the transmitting of the other command is performed by the second die while the second die is performing the refresh operation.

Example 33: An apparatus comprising: a bus of a memory device; a first die of the memory device, the first die coupled to the bus; and a second die of the memory device, the second die coupled to the bus and including a memory array, the second die configured to: receive a command from the first die via the bus, the command relating to at least one refresh operation for the second die; and performing the at least one refresh operation on the memory array responsive to the receipt of the command.

Example 34: The apparatus of example 33, wherein the bus comprises an inter-die bus that is disposed on the memory device.

Example 35: The apparatus of example 33 or example 34, wherein the inter-die bus is reserved for communications that remain in the memory device.

Example 36: A method comprising: transmitting, by a host device, a memory read request to a memory device that includes multiple dies; and transmitting, by the host device, a command to a first die of the multiple dies, the command directing the memory device to enter a self-refresh mode and causing a cascade of refresh operations across the multiple dies.

Example 37: The method of example 36, wherein the command is effective to cause the first die to coordinate a timing of multiple refresh operations across the multiple dies of the memory device.

Example 38: The method of example 36 or example 37, further comprising: causing the cascade of the refresh operations across the multiple dies starting with the first die.

Example 39: The method of any one of examples 36-38, further comprising: omitting transmission of the command to other dies of the multiple dies besides the first die.

Example 40: The method of any one of examples 36-39, further comprising: causing the cascade of the refresh operations across the multiple dies based on the transmitting of the command to the first die of the multiple dies.

Example 41: The method of any one of examples 36-40, further comprising: causing the first die to transmit another command to a second die of the multiple dies based on the transmitting of the command to the first die, the other command relating to at least one refresh operation of the second die.

Example 42: The method of any one of examples 1-17, further comprising: entering, by the first die of the memory device, the self-refresh mode responsive to the receiving the first command; and refreshing, by the first die of the memory device, a memory array of the first die based on a timing that is generated internally by the first die responsive to the entering of the self-refresh mode.

Example 43: The method of any one of examples 1-17 or 42, further comprising: determining that a time period has expired, a start of the time period corresponding to a refresh operation performed on a memory array of the first die; performing, by the first die of the memory device, another refresh operation on the memory array of the first die responsive to the determining; and transmitting, by the first die of the memory device, a third command to the second die of the memory device responsive to the determining, the third command relating to at least one refresh operation.

Example 44: An apparatus comprising: a bus of a memory device; and a second die of the memory device, the second die coupled to the bus and including a memory array, the second die configured to: receive a command from a first die via the bus, the command relating to at least one refresh operation for the second die; and performing the at least one refresh operation on the memory array responsive to the receipt of the command.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Also, as used herein, a phrase referring to "at least one of" a list of items refers to any combination of those items, including single members. For instance, "at least one of a, b, or c" can cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c, or any other ordering of a, b, and c). Further, items represented in the accompanying figures and terms discussed herein may be indicative of one or more items or terms, and thus reference may be made interchangeably to single or plural forms of the items and terms in this written description.

Conclusion

Although implementations for inter-die refresh control have been described in language specific to certain features and/or methods, the subject of the appended claims is not necessarily limited to the specific features or methods described. Rather, the specific features and methods are disclosed as example implementations for inter-die refresh control.

What is claimed is:

1. A method comprising:
   receiving, by a first die of a memory device, a first command from a host device, the first command directing the memory device to enter a self-refresh mode;
   performing at least one first refresh operation at the first die responsive to the receiving of the first command;
   transmitting, by the first die of the memory device, a second command to a second die of the memory device, the second command relating to at least one second refresh operation;
   receiving, by the second die of the memory device, the second command from the first die of the memory device;
   performing the at least one second refresh operation at the second die so as to at least partially overlap the at least one first refresh operation responsive to the receiving of the second command;
   transmitting, by the second die of the memory device, a third command to a third die of the memory device responsive to the receiving of the second command, the third command relating to at least one third refresh operation;
   receiving, by the third die of the memory device, the third command from the second die of the memory device; and
   performing the at least one third refresh operation at the third die so as to at least partially overlap the at least one second refresh operation responsive to the receiving of the third command.

2. The method of claim 1, further comprising:
   receiving, by the first die of the memory device, the first command from a memory controller of the host device.

3. The method of claim 1, further comprising:
   receiving, by the first die of the memory device, the first command from the host device via a control bus coupling the memory device to the host device.

4. The method of claim 3, wherein the control bus comprises a command and address bus that comports with at least one low-power double data rate (LPDDR) memory standard.

5. The method of claim 1, further comprising:
   entering, by the first die of the memory device, the self-refresh mode responsive to the receiving of the first command.

6. The method of claim 5, further comprising:
   refreshing, by the first die of the memory device, a memory array of the first die based on a timing that is generated internally by the first die responsive to the entering of the self-refresh mode.

7. The method of claim 1, further comprising:
   transmitting, by the first die of the memory device, the second command to the second die of the memory device using an inter-die bus that couples the first die to the second die.

8. The method of claim 1, further comprising:
   transmitting, by the first die of the memory device, the second command to a third die of the memory device.

9. The method of claim 1, further comprising:
   transmitting, by the first die of the memory device, a fourth command to the third die of the memory device, the fourth command relating to at least one fourth refresh operation, wherein
   the transmitting of the fourth command to the fourth die is performed after the transmitting of the second command to the second die.

10. The method of claim 1, further comprising:
    refreshing, by the second die of the memory device, a memory array of the second die responsive to the receiving of the second command.

11. The method of claim 10, wherein the second command comprises at least one of an all-bank refresh command or a self-refresh command.

12. The method of claim 1, further comprising:
initiating, by the first die of the memory device, a refresh operation of a memory array of the first die responsive to the receiving of the first command;
determining that a time period has expired, a start of the time period relating to the initiating of the refresh operation of the memory array of the first die; and
transmitting, by the first die of the memory device, the second command to the second die of the memory device responsive to the determining.

13. The method of claim 12, wherein the time period comprises a self-refresh interval time between starts of successive refresh operations across multiple dies of the memory device, the multiple dies including the first die, the second die, and the third die.

14. The method of claim 1, further comprising:
determining that a time period has expired, a start of the time period corresponding to a refresh operation performed on a memory array of the first die; and
performing, by the first die of the memory device, another refresh operation on the memory array of the first die responsive to the determining.

15. The method of claim 14, further comprising:
transmitting, by the first die of the memory device, a fourth command to the second die of the memory device responsive to the determining, the fourth command relating to at least one fourth refresh operation.

16. The method of claim 15, wherein the time period comprises a self-refresh interval between successive memory array refreshes within a given die of the memory device.

17. The method of claim 1, further comprising:
transmitting, by the second die of the memory device, the third command to the third die of the memory device while the second die is performing the at least one second refresh operation at the second die.

18. An apparatus comprising:
a third die of a memory device;
a second die of the memory device; and
a first die of the memory device, the first die coupled to the second die and the third die, the first die configured to:
receive a first command from a host device, the first command directing the memory device to enter a self-refresh mode;
perform at least one first refresh operation responsive to receipt of the first command; and
transmit a second command to the second die of the memory device responsive to receipt of the first command, the second command relating to at least one second refresh operation;
the second die configured to:
receive the second command from the first die of the memory device;
perform the at least one second refresh operation so as to at least partially overlap the at least one first refresh operation responsive to receipt of the second command; and
transmit a third command to the third die of the memory device responsive to receipt of the second command, the third command relating to at least one third refresh operation;
the third die configured to:
receive the third command from the second die of the memory device; and
perform the at least one third refresh operation so as to at least partially overlap the at least one second refresh operation responsive to receipt of the third command.

19. The apparatus of claim 18, further comprising:
the memory device, the memory device including:
multiple dies, the multiple dies including the first die, the second die, and the third die; and
at least one inter-die bus coupled to each die of the multiple dies.

20. The apparatus of claim 19, wherein the first die is configured to transmit the second command to the second die via the inter-die bus.

21. The apparatus of claim 19, wherein the inter-die bus is separate from an interconnect coupling the memory device to the host device.

22. The apparatus of claim 19, wherein:
the memory device comprises a memory module; and
the inter-die bus is disposed internal to the memory module.

23. The apparatus of claim 19, wherein the inter-die bus is reserved for communications that remain in the memory device.

24. The apparatus of claim 18, wherein:
the first die includes an internal reference oscillator; and
the first die is configured to transmit multiple second commands over time to the second die based on one or more time periods determined using the internal reference oscillator, each second command of the multiple second commands directing the second die to perform a refresh operation on a memory array of the second die.

25. The apparatus of claim 24, wherein:
the first die includes a temperature sensor; and
the first die is configured to transmit the multiple second commands over time to the second die based on the one or more time periods determined using the temperature sensor.

26. The apparatus of claim 24, wherein:
the second die includes an internal reference oscillator;
at least part of the memory device is configured to enter the self-refresh mode responsive to the first command; and
the second die is configured to depower the internal reference oscillator of the second die at least during the self-refresh mode of the memory device.

27. The apparatus of claim 18,
wherein the first die is configured to transmit a fourth command to the second die and the third die of the memory device responsive to receipt of a fifth command from the host device.

28. The apparatus of claim 18,
wherein the first die is configured to transmit a fourth command to the second die of the memory device and a fifth command to the third die of the memory device responsive to receipt of a sixth command from the host device, the sixth command directing the memory device to enter the self-refresh mode.

29. An apparatus comprising:
a memory device including a first die, a second die, and a third die, the first die coupled to the second die, the second die coupled to the third die;
an interconnect coupled to the memory device; and
a host device, the host device including a memory controller coupled to the interconnect, the memory controller configured to:

transmit a first command to the first die of the memory device using the interconnect, the first die of the memory device configured to:
receive the first command from the memory controller using the interconnect, the first command directing the memory device to enter a self-refresh mode;
perform at least one first refresh operation responsive to receipt of the first command; and
transmit a second command to the second die of the memory device responsive to receipt of the first command, the second command relating to at least one second refresh operation;

the second die of the memory device configured to:
receive the second command from the first die of the memory device;
perform the at least one second refresh operation so as to at least partially overlap the at least one first refresh operation responsive to receipt of the second command; and
transmit a third command to the third die of the memory device responsive to receipt of the second command, the third command relating to at least one third refresh operation; and the third die of the memory device configured to:
receive the third command from the second die of the memory device; and
perform the at least one third refresh operation so as to at least partially overlap the at least one second refresh operation responsive to receipt of the third command.

30. The apparatus of claim 29, wherein the memory device includes at least one inter-die bus coupled to the first die, the second die, and the third die.

31. The apparatus of claim 30, wherein the first die is configured to transmit the second command to the second die using the inter-die bus.

32. The apparatus of claim 30, wherein the inter-die bus is separate from the interconnect coupling the memory device to the memory controller of the host device.

33. The apparatus of claim 30, wherein:
the memory device comprises a memory module; and
the inter-die bus is disposed internal to the memory module.

34. A method comprising:
transmitting, by a host device, a first command to a first die of a memory device, the first command directing the memory device to enter a self-refresh mode;
receiving, by the first die of the memory device, the first command;
performing at least one first refresh operation at the first die responsive to the receiving of the first command;
transmitting, by the first die of the memory device, a second command to a second die of the memory device, the second command relating to at least one second refresh operation;
receiving, by the second die of the memory device, the second command from the first die of the memory device;
performing the at least one second refresh operation at the second die so as to at least partially overlap the at least one first refresh operation responsive to the receiving of the second command;
transmitting, by the second die of the memory device, a third command to a third die of the memory device responsive to the receiving of the second command, the third command relating to at least one third refresh operation;
receiving, by the third die of the memory device, the third command from the second die of the memory device; and
performing the at least one third refresh operation at the third die so as to at least partially overlap the at least one second refresh operation responsive to the receiving of the third command.

35. The method of claim 34, further comprising:
transmitting, by a memory controller of the host device, the first command to the first die of the memory device.

36. The method of claim 34, further comprising:
transmitting, by the host device, the first command to the first die of the memory device via a control bus coupling the memory device to the host device.

37. The method of claim 36, wherein the control bus comprises a command and address bus that comports with at least one low-power double data rate (LPDDR) memory standard.

38. The method of claim 34, further comprising:
transmitting, by the host device, the first command to the first die of the memory device using an interconnect that couples the memory device to the host device; and
receiving, by the first die of the memory device, the first command using the interconnect.

39. The method of claim 38, further comprising:
transmitting, by the first die of the memory device, the second command to the second die of the memory device using an inter-die bus that couples the first die to the second die; and
receiving, by the second die of the memory device, the second command from the first die of the memory device using the inter-die bus.

40. The method of claim 39, wherein the inter-die bus is separate from the interconnect.

* * * * *